US011469230B2

(12) United States Patent
Karda et al.

(10) Patent No.: US 11,469,230 B2
(45) Date of Patent: Oct. 11, 2022

(54) VERTICALLY SEPARATED STORAGE NODES AND ACCESS DEVICES FOR SEMICONDUCTOR DEVICES

(71) Applicant: Micron Technology, Inc., Boise, ID (US)

(72) Inventors: Kamal M. Karda, Boise, ID (US); Haitao Liu, Boise, ID (US); Litao Yang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/188,083

(22) Filed: Mar. 1, 2021

(65) Prior Publication Data

US 2022/0278105 A1   Sep. 1, 2022

(51) Int. Cl.
*H01L 27/108* (2006.01)
*H01L 27/11507* (2017.01)

(52) U.S. Cl.
CPC .... *H01L 27/10805* (2013.01); *H01L 27/1085* (2013.01); *H01L 27/10873* (2013.01); *H01L 27/11507* (2013.01)

(58) Field of Classification Search
None
See application file for complete search history.

(56) References Cited

U.S. PATENT DOCUMENTS

| | | | |
|---|---|---|---|
| 6,734,062 B2 * | 5/2004 | Gonzalez | H01L 27/10858 257/E21.65 |
| 10,607,995 B2 | 3/2020 | Roberts et al. | |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2021/0013226 A1 | 1/2021 | Tang et al. | |

\* cited by examiner

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for an array of vertically stacked memory cells. The vertically stacked memory cells have horizontally oriented access devices having a first source/drain region, a channel region, and a second source drain and storage nodes that are vertically separated from the access devices.

18 Claims, 15 Drawing Sheets

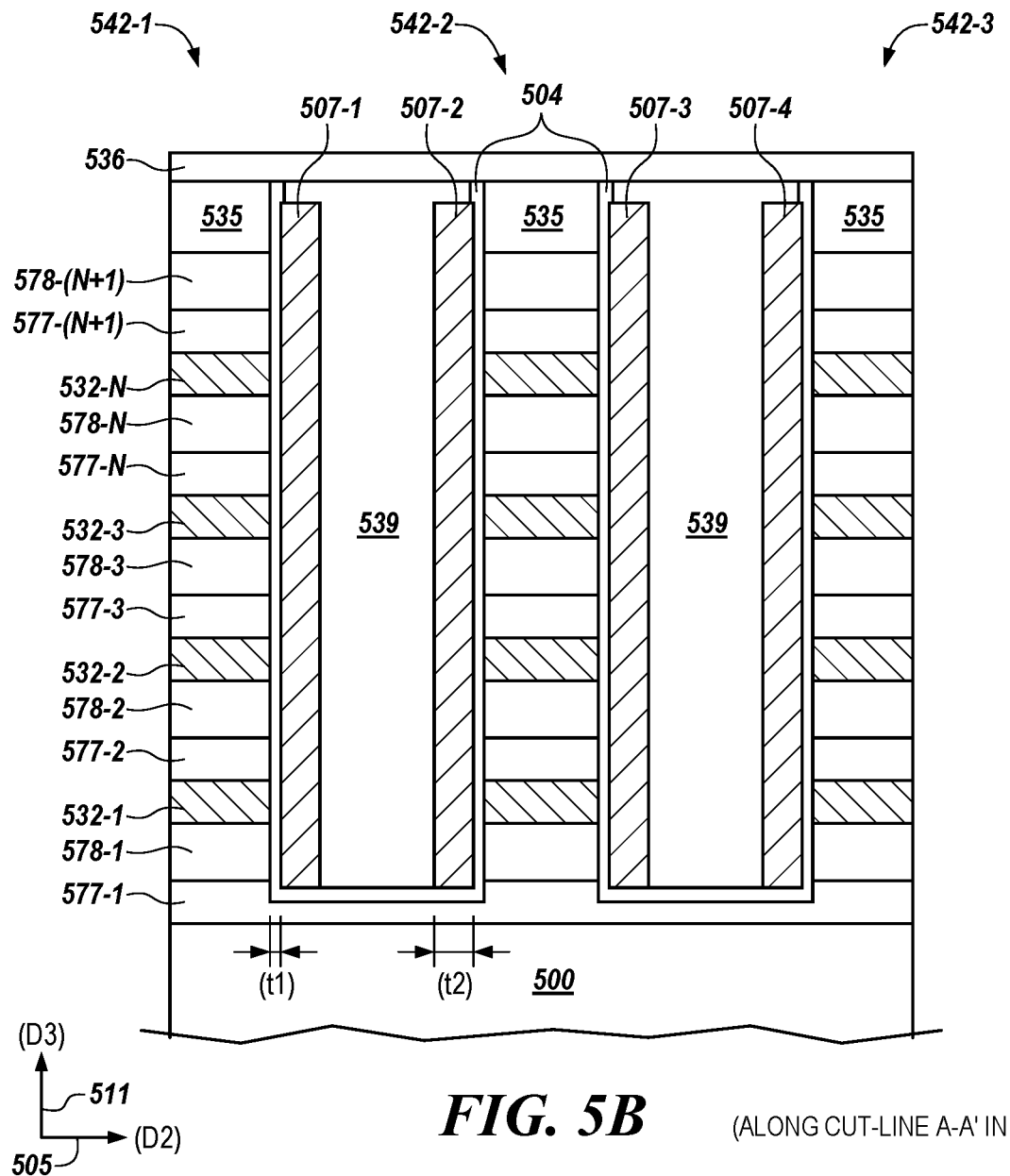
FIG. 5B (ALONG CUT-LINE A-A' IN FIG 5A)

(ALONG CUT-LINE C-C' IN FIG 6A)

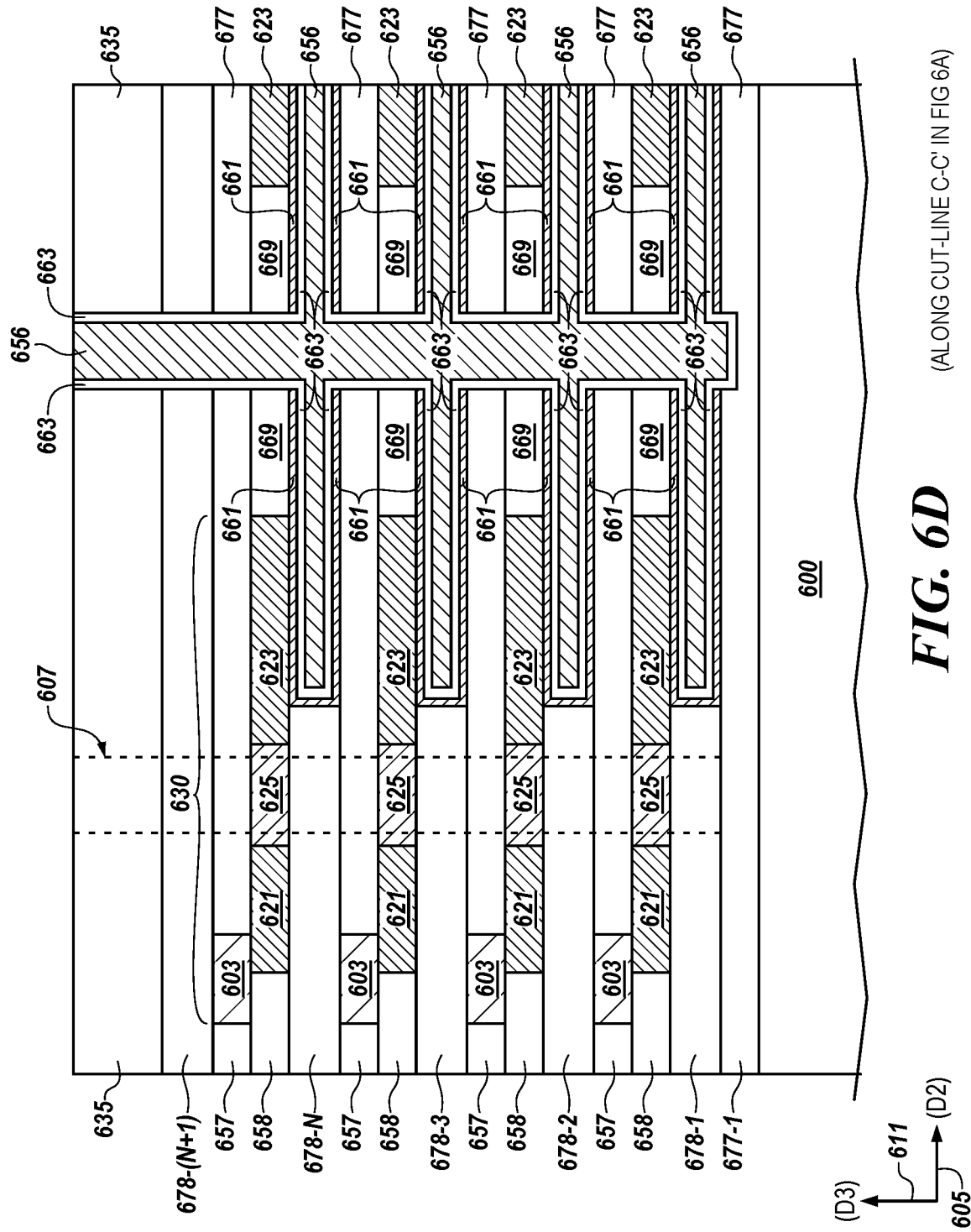
FIG. 6D (ALONG CUT-LINE C-C' IN FIG 6A)

VERTICALLY SEPARATED STORAGE NODES AND ACCESS DEVICES FOR SEMICONDUCTOR DEVICES

TECHNICAL FIELD

The present disclosure relates generally to memory devices, and more particularly, to a three-dimensional memory having vertically separated storage nodes and access devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory, e.g., phase-change random access memory, resistive memory, e.g., resistive random-access memory, cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the access device. A DRAM cell can include a storage node, such as a capacitor cell, coupled by the access device to a digit line. The access device can be enabled, e.g., to select the cell, by activating the access line to which its gate is coupled. The capacitor can store a charge corresponding to a data value of a respective cell, e.g., a logic "1" or "0".

BRIEF DESCRIPTION OF THE DRAWINGS

FIG. 5B is a cross sectional view, taken along cut-line A-A' in FIG. 5A, showing another view of the semiconductor structure at a particular time in the semiconductor fabrication process.

FIG. 6D illustrates a view of the semiconductor structure at a particular time in the fabrication process in accordance with a number of embodiments of the present disclosure.

DETAILED DESCRIPTION

Figure 1A:
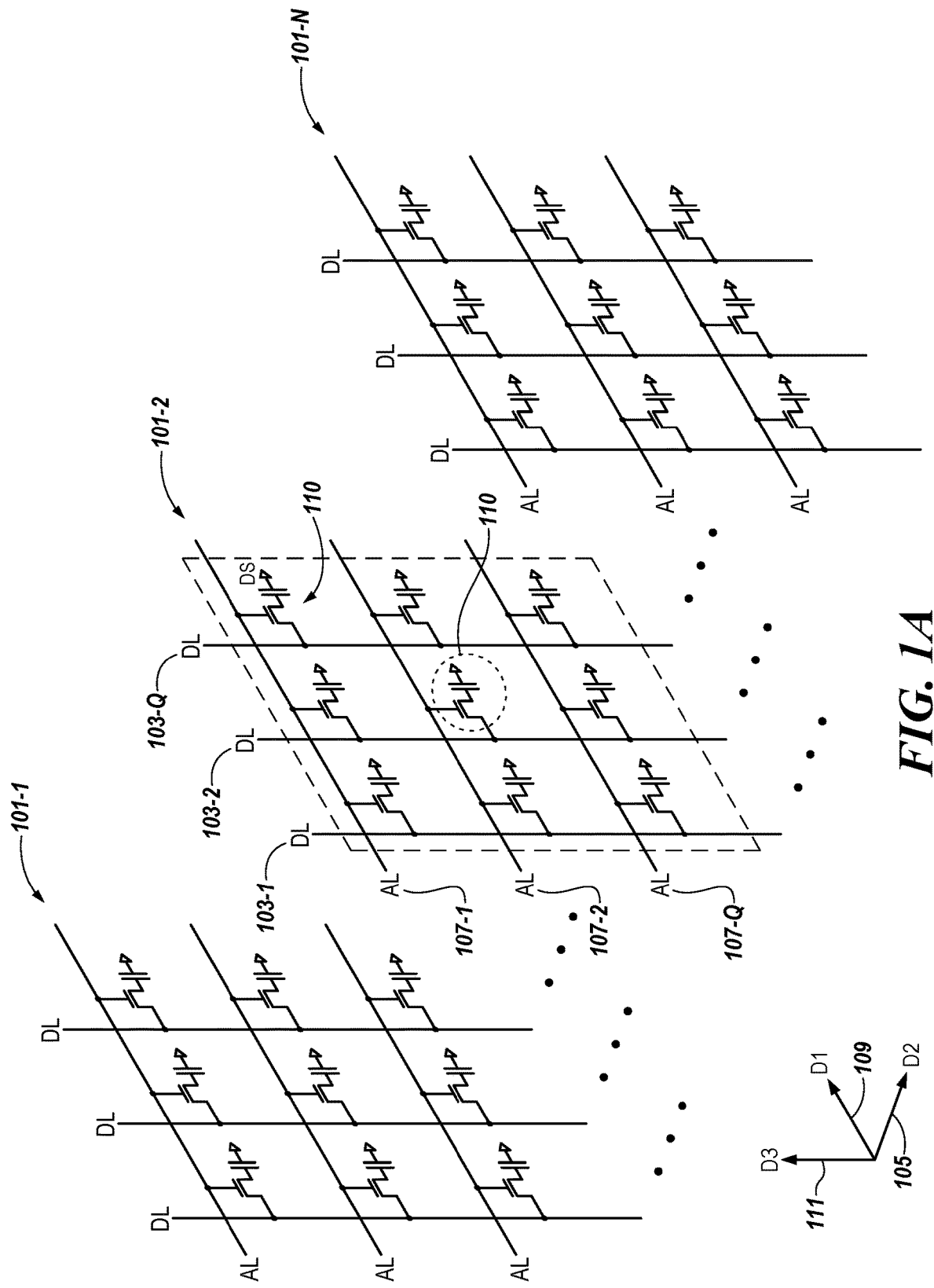
FIG. 1A is a diagram of an apparatus in accordance with a number of embodiments of the present disclosure.

Embodiments of the present disclosure describe a three-dimensional memory having horizontally oriented access devices and horizontally oriented storage nodes, wherein the horizontally oriented storage nodes are vertically separated from the horizontally oriented access devices. The horizontally oriented access devices include a first source/drain region and a second source/drain region separated by a channel region. Embodiments of the present disclosure provide that the second source/drain region includes a second source/drain region vertical surface and a second source/drain region horizontal surface, and wherein the second source/drain region horizontal surface has an area greater than the second source/drain region vertical surface. This second source/drain region horizontal surface provides an interface with the storage node. The greater area of the second source/drain region horizontal surface can advantageously provide an improved, i.e. reduced, contact resistance. Desirably, this improved contact resistance may provide that different materials, e.g., materials having a lower mobility, may be utilized, among other benefits.

The figures herein follow a numbering convention in which the first digit or digits correspond to the figure number of the drawing and the remaining digits identify an element or component in the drawing. Similar elements or components between different figures may be identified by the use of similar digits. For example, reference numeral 111 may reference element "11" in FIG. 1, and a similar element may be referenced as 211 in FIG. 2. Multiple analogous elements within one figure may be referenced with a reference numeral followed by a hyphen and another numeral or a letter. For example, 103-1 may reference element 103-1 in FIGS. 1 and 103-2 may reference element 103-2, which may be analogous to element 103-1. Such analogous elements may be generally referenced without the hyphen and extra numeral or letter. For example, elements 103-1 and 103-2 or other analogous elements may be generally referenced as 103. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

FIG. 1A is a diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, ..., 101-N. The sub cell arrays 101-1, 101-2, ..., 101-N may be arranged along a second direction (D2) 105. Each of the sub cell arrays, e.g., sub cell array 101-2, may include a plurality of access lines 107-1, 107-2, ..., 107-Q (which also may be referred to a word lines). Also, each of the sub cell arrays, e.g., sub cell array 101-2, may include a plurality of digit lines 103-1, 103-2, ..., 103-Q (which also may be referred to as bit lines, data lines, or sense lines). In FIG. 1A, the access lines 107-1, 107-2, ..., 107-Q are illustrated extending in a first direction (D1) 109 and the digit lines 103-1, 103-2, ..., 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, ..., 103-Q are extending in a vertical direction, e.g., third direction (D3) 111.

A memory cell, e.g., 110, may include an access device, e.g., access transistor, and a storage node located at an intersection of each access line 107-1, 107-2, ..., 107-Q and each digit line 103-1, 103-2, ..., 103-Q. Memory cells may be written to, or read from, using the access lines 107-1, 107-2, ..., 107-Q and digit lines 103-1, 103-2, ..., 103-Q. The access lines 107-1, 107-2, ..., 107-Q may conductively interconnect memory cells along horizontal rows of each sub cell array 101-, 101-2, ..., 101-N, and the digit lines 103-1, 103-2, ..., 103-Q may conductively interconnect memory cells along vertical columns of each sub cell array 101-, 101-2, ..., 101-N. One memory cell, e.g. 110, may be located between one access line, e.g., 107-2, and one digit line, e.g., 103-2. Each memory cell may be uniquely addressed through a combination of an access line 107-1, 107-2, ..., 107-Q and a digit line 103-1, 103-2, ..., 103-Q.

The access lines 107-1, 107-2, ..., 107-Q may be or include conducting patterns, e.g., metal lines, disposed on and spaced apart from a substrate. The access lines 107-1, 107-2, ..., 107-Q may extend in a first direction (D1) 109. The access lines 107-1, 107-2, ..., 107-Q in one sub cell array, e.g., 101-2, may be spaced apart from each other in a vertical direction, e.g., in a third direction (D3) 111.

The digit lines 103-1, 103-2, ..., 103-Q may be or include conductive patterns, e.g., metal lines, extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
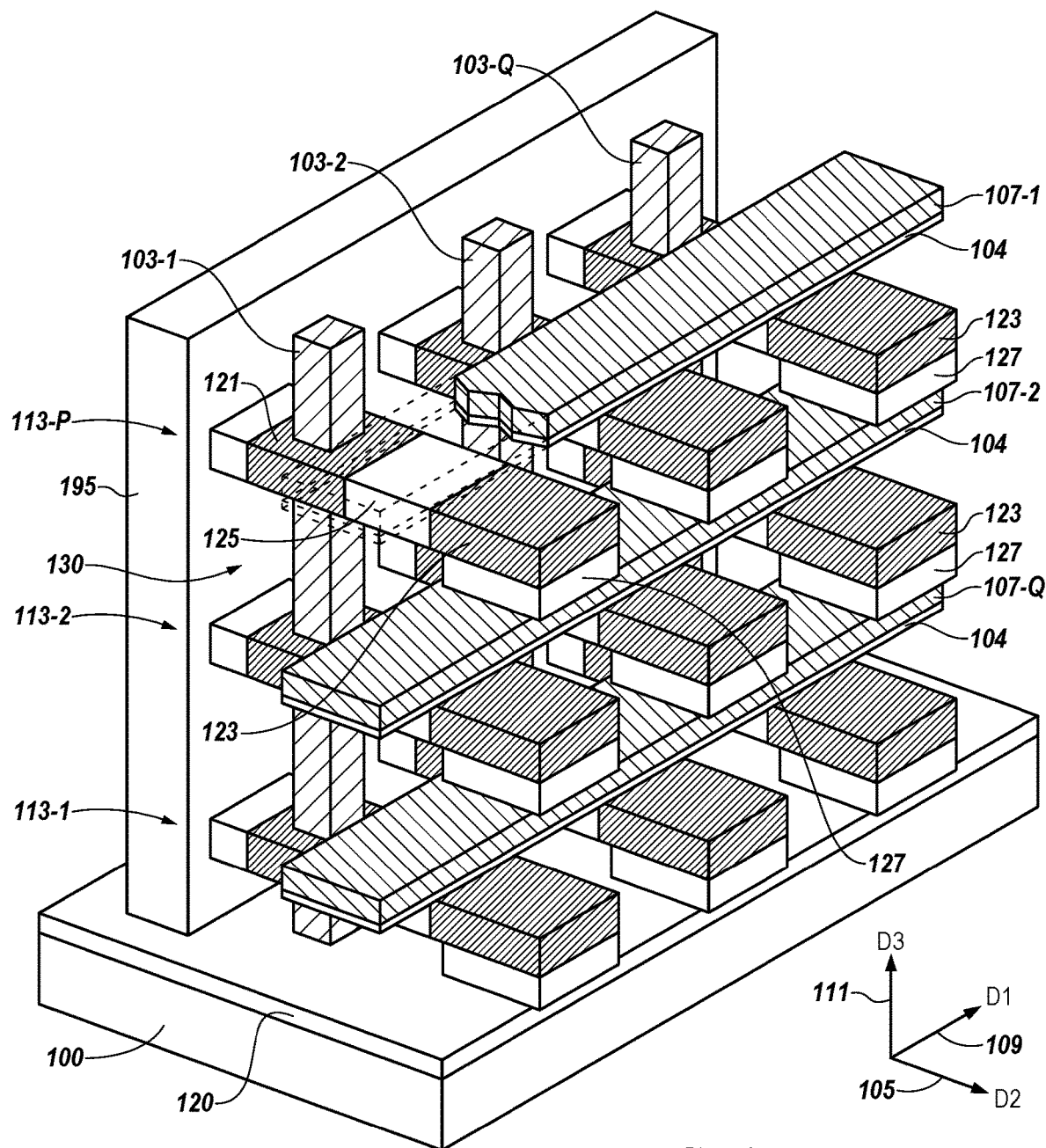
FIG. 1B is a perspective view illustrating a portion a three dimensional (3D) semiconductor memory device in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon a number of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., third direction (D3) 111. According to some embodiments the vertically oriented stack of memory cells may be fabricated such that each memory cell, e.g., memory cell 110 in FIG. 1A, is formed on plurality of vertical levels, e.g., a first level 113-1 (L1), a second level 113-2 (L2), and a third level 113-P (L3). While three levels are illustrated in FIG. 1A embodiments are not so limited, for instance, more than three or fewer than three vertical levels may be utilized. The repeating, vertical levels, L1, L2, and L3, may be arranged, e.g., "stacked", a vertical direction, e.g., third direction (D3) 111 shown in FIG. 1A, and may be separated from the substrate 100 by an insulator material 120. Each of the repeating, vertical levels, L1, L2, and L3 may include a plurality of discrete components, e.g., regions, to the horizontally oriented access devices 130, e.g., transistors, and storage nodes, including access line 107-1, 107-2, ..., 107-Q connections and digit line 103-1, 103-2, ..., 103-Q connections. The plurality of discrete components to the horizontally oriented access devices 130, may be formed in a plurality of iterations of vertically, repeating layers within each level.

The horizontally oriented access devices 130 may include a first source/drain region 121 and a second source/drain region 123 separated by a channel region 125, extending laterally in the second direction (D2) 105, and formed in a body of the access devices. In some embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, may be connected to the second source/drain region 123 of the access device. As previously mentioned and as shown in FIG. 1B, the horizontally oriented storage nodes are vertically separated, as discussed further herein, from the horizontally oriented access devices. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, ..., 107-Q extend in the first direction (D1) 109, analogous to the first direction (D1) 109 in FIG. 1A. The plurality of horizontally oriented access lines 107-1, 107-2, ..., 107-Q may be arranged, e.g., "stacked", along the third direction (D3) 111. The plurality of horizontally oriented access lines 107-1, 107-2, ..., 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 130, e.g., first source/drain region 121 and second source/drain region 123 separated by a channel region 125, extending laterally in the second direction (D2) 105, and the plurality of horizontally oriented access lines 107-1, 107-2, ..., 107-Q extending laterally in the first direction (D1) 109, may be formed within different vertical layers within each level. For example, the plurality of horizontally oriented access lines 107-1, 107-2, ..., 107-Q, extending in the first direction (D1) 109, may be formed on a top surface opposing and electrically coupled to the channel regions 125, separated therefrom by a gate dielectric, and orthogonal to horizontally oriented access devices 130, e.g., transistors, extending in laterally in the second direction (D2) 105. In some embodiments, the plurality of horizontally oriented access lines 107-1, 107-2, ..., 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, ..., 103-Q, extend in a vertical direction with respect to the substrate 100, e.g., in a third direction (D3) 111. Further, as shown in FIG. 1B, the digit lines, 103-1, 103-2, ..., 103-Q, in one sub cell array, e.g., sub cell array 101-2 in FIG. 1A, may be spaced apart from each other in the first direction (D1) 109. The digit lines, 103-1, 103-2, ..., 103-Q, may be provided, extending vertically relative to the substrate 100 in the third direction (D3) 111 in vertical alignment with source/drain regions to serve as first source/drain regions 121 or, as shown, be vertically adjacent first source/drain regions 121 for each of the horizontally oriented access devices 130 extending laterally in the second direction (D2) 105, but adjacent to each other on a level, e.g., first level (L1), in the first direction (D1) 109. Each of the digit lines, 103-1, 103-2, ..., 103-Q, may vertically extend, in the third direction (D3), on sidewalls, adjacent first source/drain regions 121, of respective ones of the plurality of horizontally oriented access devices 130 that are vertically stacked. In some embodiments, the plurality of vertically oriented digit lines 103-1, 103-2, ..., 103-Q, extending in the third direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 130 in the first level (L1) 113-1, a sidewall of a first source/drain region 121 of a first one of the horizontally oriented access devices 130 in the second level (L2) 113-2, and a sidewall of a first source/drain region 121 a first one of the horizontally oriented access devices 130 in the third level (L3) 113-P, etc. Similarly, a second one of the vertically extending digit lines, e.g., 103-2, may be adjacent a sidewall to a first source/drain region 121 of a second one of the horizontally oriented access devices 130 in the first level (L1) 113-1, spaced apart from the first one of horizontally oriented access devices 130 in the first level (L1) 113-1 in the first direction (D1) 109. And the second one of the vertically extending digit lines, e.g., 103-2, may be adjacent a sidewall of a first source/drain region 121 of a second one of the laterally oriented access devices 130 in the second level (L2) 113-2, and a sidewall of a first source/drain region 121 of a second one of the horizontally oriented access devices 130 in the third level (L3) 113-P, etc. Embodiments are not limited to a particular number of levels. The vertically extending digit lines, 103-1, 103-2, ..., 103-Q, may include a conductive material, such as, for example, one of a doped semiconductor material, a conductive metal nitride, metal, and/or a metal-semiconductor compound.

One or more embodiments include a conductive body contact. As shown in FIG. 1B, a conductive body contact may be formed extending in the first direction (D1) 109 along an end surface of the horizontally oriented access devices 130, e.g., transistors, in each level (L1) 113-1, (L2) 113-2, and (L3) 113-P above the substrate 100. The body contact may be connected to a body, e.g., body region, of the horizontally oriented access devices 130 in each memory cell. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 1C:
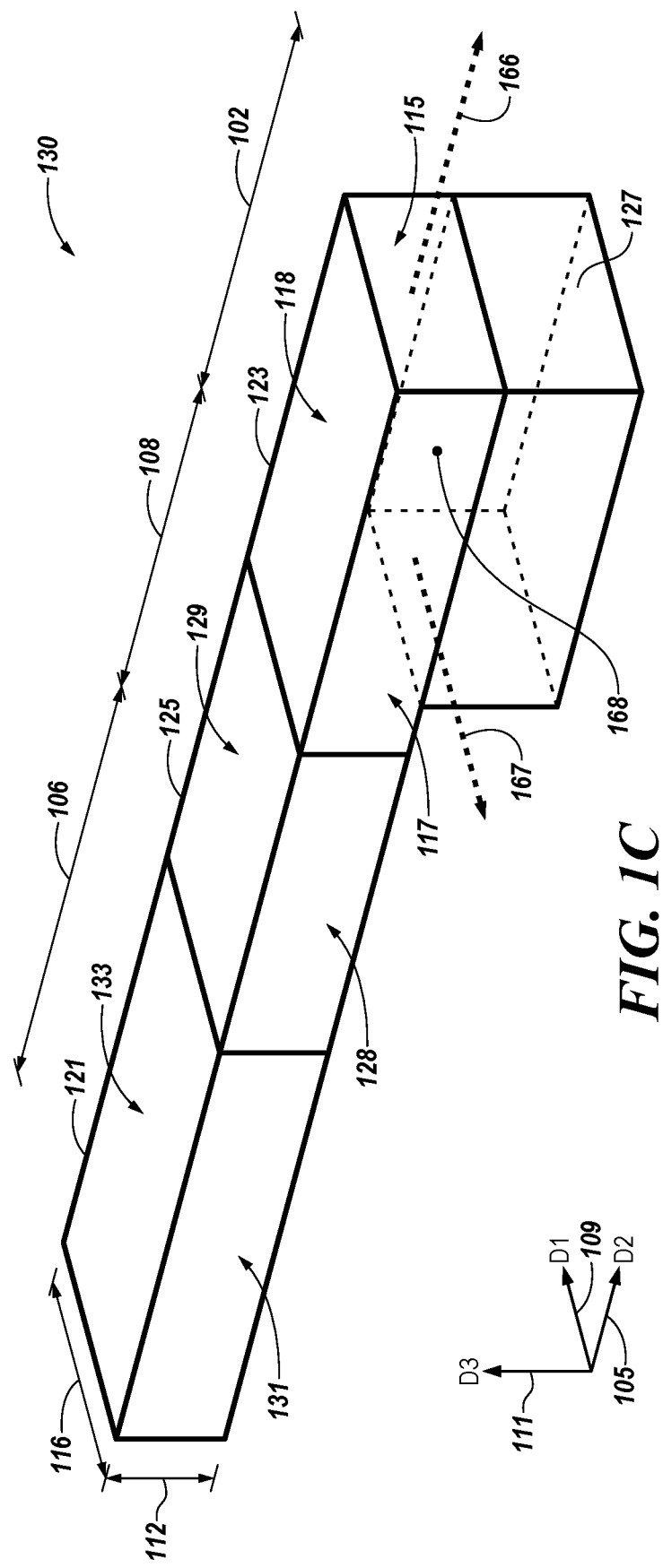
FIG. 1C is a perspective view illustrating a portion of a three-node access device in a vertical three dimensional (3D) memory cell in accordance with a number of embodiments of the present disclosure.

FIG. 1C is a perspective view illustrating a portion of a three-node access device in a vertical three dimensional (3D) memory cell in accordance with a number of embodiments of the present disclosure. As mentioned, embodiments provide that the access devices 130 include a first source/drain region 121, a channel region 125, and a second source/drain region 123.

As shown in FIG. 1C, each of the first source/drain region 121, the channel region 125, and the second source/drain region 123 may be represented as cuboids, e.g., rectangular prisms. The first source/drain region 121 has a horizontal length 106, the channel region 125 has a horizontal length 108, and the second source/drain region 123 has a horizontal length 102. The first source/drain region 121, the channel region 125, and the second source/drain region 123 each have a horizontal length 102 a vertical height 112. The first source/drain region 121, the channel region 125, and the second source/drain region 123 each have a horizontal length 102 a width 116. The horizontal length 106, the horizontal length 108, the horizontal length 102, the vertical height 112, and the width 116 may each have differing values for various applications.

A number of embodiments provide that the horizontal length 102 of the second source/drain region 123 is greater than the horizontal length 106 of the first source/drain region 121. For instance, the horizontal length 102 may be 5%, 10%, 25%, 50%, 100%, or 200% greater, among other values, than the horizontal length 106. Embodiments are not limited to these values.

A number of embodiments provide that the horizontal length 106 of the first source/drain region 121 is greater than the vertical height 112. For instance, the horizontal length 106 may be 5%, 10%, 25%, 50%, 100%, or 200% greater, among other values, than the vertical height 112. Embodiments are not limited to these values.

A number of embodiments provide that the width 116 is equal to or greater than the vertical height 112. For instance, the width 116 may be 5%, 10%, 25%, 50%, 100%, or 200% greater, among other values, than the vertical height 112. Embodiments are not limited to these values.

The second source/drain region 123, the first source/drain region 121, and the channel region 125 can each be considered to comprise, e.g., be constrained by, six respective surfaces. The six surfaces include two horizontal surfaces and four vertical surfaces. Horizontal surfaces are formed in a D1 109 and D2 105 plane. Vertical surfaces are formed in a D3 111 and D1 109 plane or a D3 111 and D2 105 plane.

As shown in FIG. 1C, the second source/drain region 123 comprises a vertical surface 115. While not shown in FIG. 1C, the second source/drain region 123 also comprises a vertical surface, which is similar to vertical surface 115, at an interface of the second source/drain region 123 and the channel region 125. As shown in FIG. 1C, the second source/drain region 123 comprises a vertical surface 117. While not shown in FIG. 1C, the second source/drain region 123 also comprises a vertical surface, which is similar to vertical surface 117, that is transverse the second source/drain region 123 to the vertical surface 117. As shown in FIG. 1C, the second source/drain region 123 comprises a horizontal surface 118. While not shown in FIG. 1C, the second source/drain region 123 also comprises a horizontal surface, which is similar to horizontal surface 118, that is transverse the second source/drain region 123 to the horizontal surface 118.

While not shown in FIG. 1C, the channel region 125 comprises two vertical surfaces, which are similar to vertical surface 115, a first being located at an interface of the second source/drain region 123 and the channel region 125 and a second being located at an interface of the channel region 125 and first source/drain region 121. As shown in FIG. 1C, the channel region 125 comprises a vertical surface 128. While not shown in FIG. 1C, the channel region 125 also comprises a vertical surface, which is similar to vertical surface 128, that is transverse the channel region 125 to the vertical surface 128. As shown in FIG. 1C, the channel region 125 comprises a horizontal surface 129. While not shown in FIG. 1C, the channel region 125 also comprises a horizontal surface, which is similar to horizontal surface 129, that is transverse the channel region 125 to the horizontal surface 129.

While not shown in FIG. 1C, the first source/drain region 121 comprises two vertical surfaces, which are similar to vertical surface 115, a first being located at an interface of the first source/drain region 121 and the channel region 125 and a second that is transverse the first source/drain region to the first. As shown in FIG. 1C, the first source/drain region 121 comprises a vertical surface 131. While not shown in FIG. 1C, the first source/drain region 121 also comprises a vertical surface, which is similar to vertical surface 131, that is transverse the first source/drain region 121 to the vertical surface 131. As shown in FIG. 1C, the first source/drain region 121 comprises a horizontal surface 133. While not shown in FIG. 1C, the first source/drain region 121 also comprises a horizontal surface, which is similar to horizontal surface 133, that is transverse the first source/drain region 121 to the horizontal surface 133.

Embodiments of the present disclosure provide that the horizontal surface 118, as well as the horizontal surface, which is similar to horizontal surface 118, that is transverse the second source/drain region 123 to the horizontal surface 118 have a greater area than an area of the vertical surface 115. For instance, the horizontal surface area, e.g., the surface of horizontal surface 118, may be 5%, 10%, 25%, 50%, 100%, or 200% greater, among other values, than the surface area of vertical surface 115. Embodiments are not limited to these values. In other words, embodiments provide that a product of horizontal length 102 and width 116 is greater than a product of vertical height 112 and width 116.

One or more embodiments of the present disclosure provide that the horizontal surface 118, as well as the horizontal surface, which is similar to horizontal surface 118, that is transverse the second source/drain region 123 to the horizontal surface 118 have a greater area than an area of the horizontal surface 133 that is transverse the first source/drain region 121. For instance, the horizontal surface area, e.g., the surface of horizontal surface 118, may be 5%, 10%, 25%, 50%, 100%, or 200% greater, among other values, than the surface area of horizontal surface 133. Embodiments are not limited to these values. In other words, one or more embodiments provide that a product of horizontal length 102 and width 116 is greater than a product of horizontal length 106 and width 116.

One or more embodiments of the present disclosure provide that a volume of the second source/drain region 123 is greater than a volume of the first source/drain region 121. For instance, the volume of the second source/drain region 123 may be 5%, 10%, 25%, 50%, 100%, or 200% greater, among other values, than the volume of the first source/drain region 121. Embodiments are not limited to these values. In other words, one or more embodiments provide that a product of horizontal length 102, vertical height 112, and width 116 is greater than a product of horizontal length 106, vertical height 112, and width 116.

As shown in FIG. 1C, the access device 130 is vertically separated from the storage node 127, e.g., the storage node 127 is vertically below the access device 130. As used herein when referring to a physical location of the access device in relation to the storage node, "vertically separated" indicates that any normal line extending from any vertical surface of the access device 130 will not intersect the storage node 127. For instance, normal line 66 extends away from vertical surface 115 and does not intersect the storage node 127;

similarly, normal line 67 extends away from vertical surface 117 and does not intersect the storage node 127.

As previously mentioned, the second source/drain region 123 horizontal surface provides an interface 168 with the storage node 127. The interface 168 comprises a portion of the horizontal surface that is transverse the horizontal surface 118. An area of the interface 168 can have different values for various applications. Embodiments provide that the area of the interface 168 can be 99%, 95%, 90%, 85%, 80%, 75%, 70%, 60%, or 50% of an area of the horizontal surface that is transverse the horizontal surface 118. Embodiments are not limited to these values. In other words, the area of the interface 168 can be 99%, 95%, 90%, 85%, 80%, 75%, 70%, 60%, or 50% of a product of the horizontal length 102 and the width 116. Embodiments provide that the area of the interface 168 is greater than an area of the vertical surface 115. For instance, the area of the interface 168, may be 5%, 10%, 25%, 50%, 100%, or 200% greater, among other values, than the surface area of vertical surface 115. Embodiments are not limited to these values. In other words, embodiments provide that the area of the interface 168 is greater than a product of vertical height 112 and width 116.

Figure 2A:
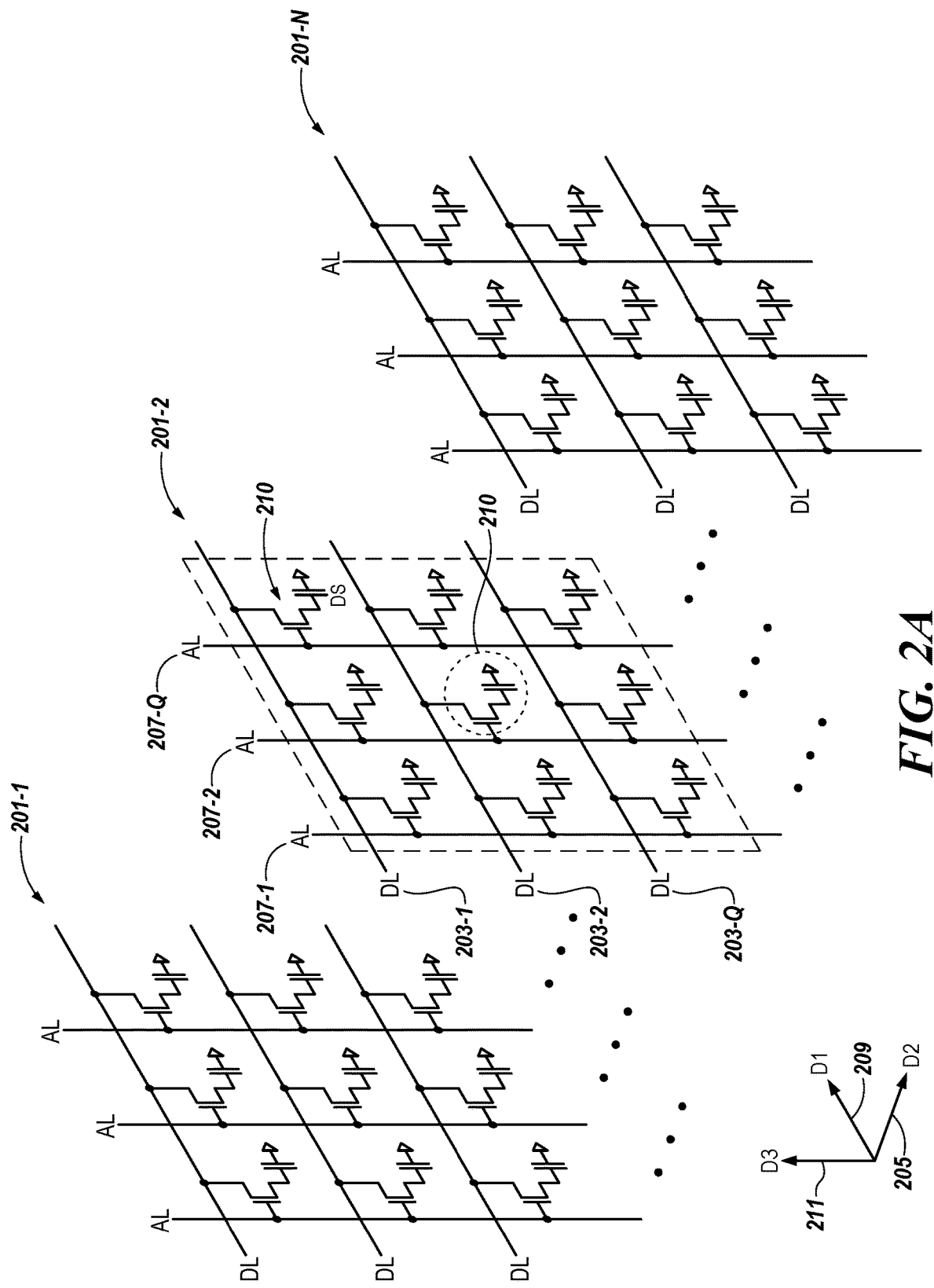
FIG. 2A is a diagram of an apparatus in accordance with a number of embodiments of the present disclosure.

FIG. 2A is a diagram of an apparatus in accordance with a number of embodiments of the present disclosure. FIG. 2A illustrates a circuit diagram showing a cell array of a three dimensional (3D) semiconductor memory device according to embodiments of the present disclosure. FIG. 2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays, e.g., sub cell array 201-2, may include a plurality of access lines 207-1, 207-2, . . . , 207-Q. Also, each of the sub cell arrays, e.g., sub cell array 201-2 may include a plurality of digit lines 203-1, 203-2, . . . , 203-Q. In FIG. 2A, the digit lines 203-1, 203-2, . . . , 203-Q are illustrated extending in a first direction (D1) 209 and the access lines 207-1, 207-2, . . . , 207-Q are illustrated extending in a third direction (D3) 211.

As previously mentioned, the first direction (D1) 209 and the second direction (D2) 205 may be considered in a horizontal ("X-Y") plane. The third direction (D3) 211 may be considered in a vertical ("Z") direction, e.g., perpendicular to the X-Y plane. Hence, according to embodiments described herein, the access lines 207-1, 207-2, . . . , 207-Q are extending in a vertical direction, e.g., third direction (D3) 211.

A memory cell, e.g., 210, may include an access device, e.g., access transistor, and a storage node located at an intersection of each access line 207-1, 207-2, . . . , 207-Q and each digit line 203-1, 203-2, . . . , 203-Q. Memory cells may be written to, or read from, using the access lines 207-1, 207-2, . . . , 207-Q and digit lines 203-1, 203-2, . . . , 203-Q. The digit lines 203-1, 203-2, . . . , 203-Q may conductively interconnect memory cells along horizontal columns of each sub cell array 201-, 201-2, . . . , 201-N, and the access lines 207-1, 207-2, . . . , 207-Q may conductively interconnect memory cells along vertical rows of each sub cell array 201-1, 201-2, . . . , 201-N. One memory cell, e.g., 210, may be located between one access line, e.g., 207-2, and one-digit line, e.g., 203-2. Each memory cell may be uniquely addressed through a combination of an access line 207-1, 207-2, . . . , 207-Q and a digit line 203-1, 203-2, . . . , 203-Q.

The digit lines 203-1, 203-2, . . . , 203-Q may be or include conducting patterns, e.g., metal lines, disposed on and spaced apart from a substrate. The digit lines 203-1, 203-2, . . . , 203-Q may extend in a first direction (D1) 209. The digit lines 203-1, 203-2, . . . , 203-Q in one sub cell array, e.g., 201-2, may be spaced apart from each other in a vertical direction, e.g., in a third direction (D3) 211.

The access lines 207-1, 207-2, . . . , 207-Q may be or include conductive patterns, e.g., metal lines, extending in a vertical direction with respect to the substrate, e.g., in a third direction (D3) 211. The access lines in one sub cell array, e.g., 201-2, may be spaced apart from each other in the first direction (D1) 209.

A gate of a memory cell, e.g., memory cell 210, may be connected to an access line, e.g., 207-2, and a first conductive node, e.g., first source/drain region, of an access device of the memory cell 210 may be connected to a digit line, e.g., 203-2. Each of the memory cells may be connected to a storage node. A second conductive node, e.g., second source/drain region, of the access device of the memory cell 210 may be connected to the storage node. Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x)Ti(1-x)]O3), barium titanate (BaTiO3), aluminum oxide (e.g., Al2O3), a combination of these with or without dopants, or other suitable materials. As discussed with FIG. 1C, the access devices are vertically separated from the storage nodes.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 203-2, and the other may be connected to a storage node.

Figure 2B:
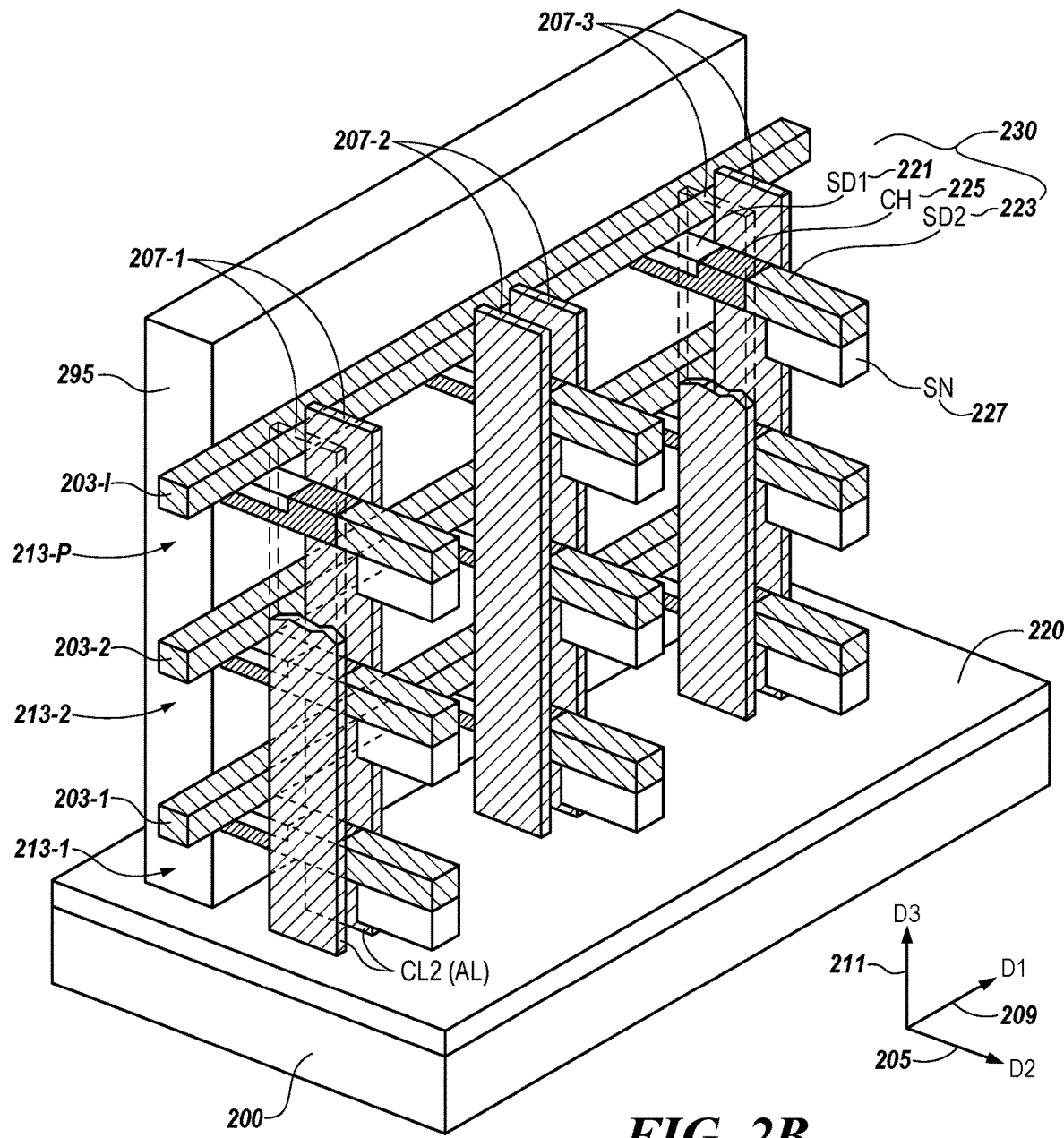
FIG. 2B illustrates a perspective view showing a three dimensional (3D) semiconductor memory device according to some embodiments of the present disclosure.
Figure 3:
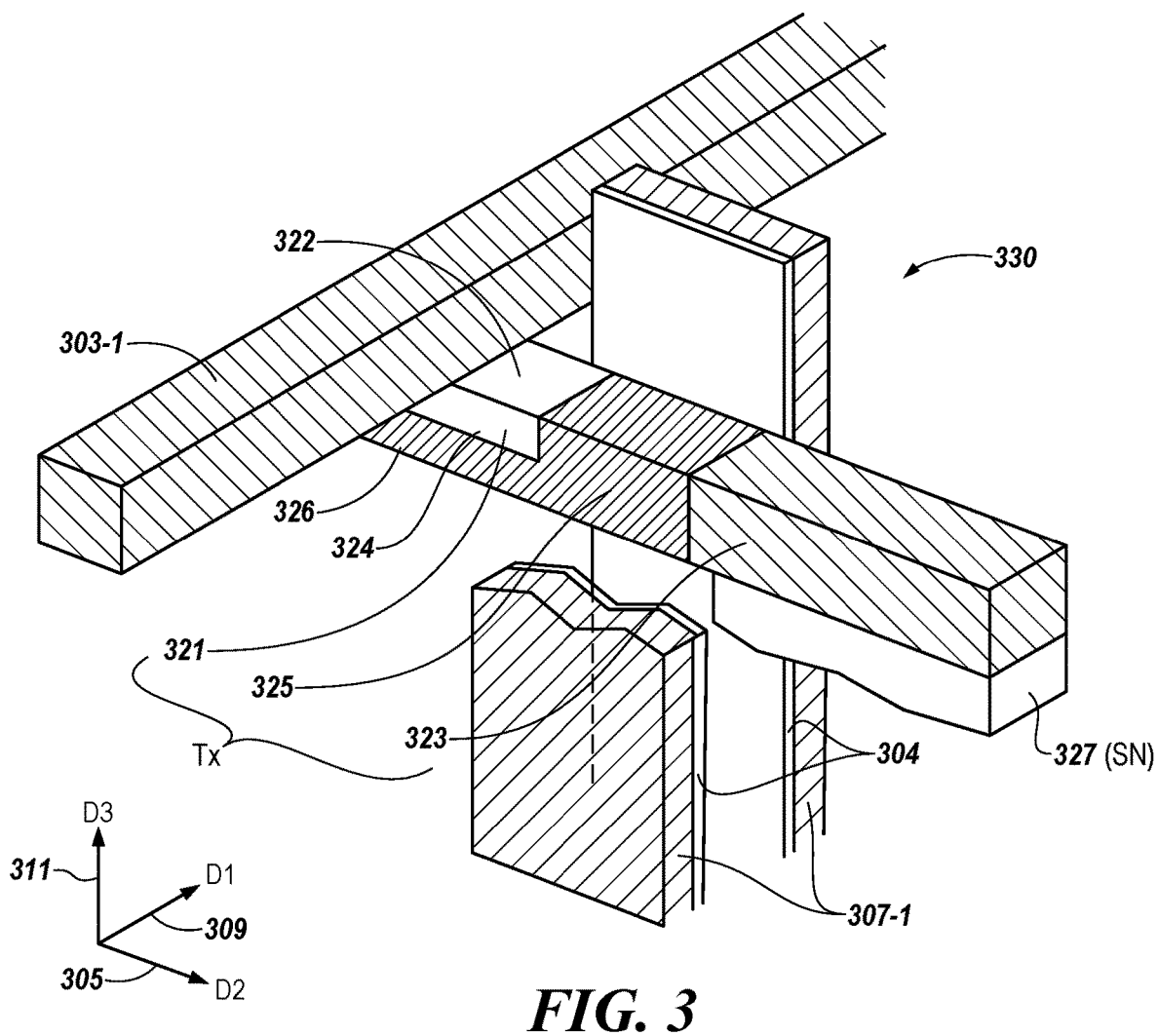
FIG. 3 illustrates portions of a unit cell of a vertically stacked array of memory cells according to some embodiments of the present disclosure.

FIG. 2B illustrates a perspective view showing a three dimensional (3D) semiconductor memory device according to some embodiments of the present disclosure. FIG. 3 illustrates a perspective view showing unit cell of the 3D semiconductor memory device.

As shown in FIG. 2B, a substrate 200 may have formed thereon one of the plurality of sub cell arrays. As shown in the embodiment of FIG. 2B, the substrate 200 may have fabricated thereon a vertically oriented stack of memory cells extending in a vertical direction, e.g., third direction (D3) 211. According to some embodiments the vertically oriented stack of memory cells may be fabricated such that each memory cell, e.g., as shown in FIG. 1C, is formed on plurality of vertical levels, e.g., a first level (L1), a second level (L2), and a third level (L3). The repeating, vertical levels, L1, L2, and L3, may be arranged, e.g., stacked, in a vertical direction, e.g., third direction (D3) 211, and may be separated from the substrate 200 by an insulator material 220. Each of the repeating, vertical levels, L1, L2, and L3 may include a plurality of discrete components to the horizontally oriented access devices 230 and storage nodes including access line 207-1, 207-2, . . . , 207-Q connections and digit line 203-1, 203-2, . . . , 203-Q connections. The plurality of discrete components to the horizontally, i.e., laterally, oriented access devices 230 may be formed in a plurality of iterations of vertically, repeating layers within each level, as herein.

The plurality of discrete components to the laterally oriented access devices 230 may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

As previously discussed, the second source/drain region 223 includes a horizontal surface that provides an interface with the storage node 227. As shown in FIG. 2B, the storage node 227 may be connected to the second source/drain region 223 of the access device, e.g., the second source/drain region 223 may directly contact the storage node 227. Each of the storage nodes may be a memory element using one of a capacitor, a magnetic tunnel junction pattern, and/or a variable resistance body which includes a phase change material, etc. Embodiments, however, are not limited to these examples.

As shown in FIG. 2B a plurality of horizontally oriented digit lines 203-1, 203-2, . . . , 203-Q extend in the first direction (D1) 209, e.g., analogous to the first direction (D1) 209 in FIG. 2A. The plurality of horizontally oriented digit lines 203-1, 203-2, . . . , 203-Q may be arranged, e.g., stacked, along the third direction (D3) 211. The plurality of horizontally oriented digit lines 203-1, 203-2, . . . , 203-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the horizontally oriented memory cells may be spaced apart from one another horizontally in the first direction (D1) 209. However, as described in more detail below in connection with FIG. 4A, et seq., the plurality of discrete components to the laterally oriented access devices 230, e.g., first source/drain region 221 and second source/drain region 223 separated by a channel region 225, extending laterally in the second direction (D2) 205, and the plurality of horizontally oriented digit lines 203-1, 203-2, . . . , 203-Q, extending laterally in the first direction (D1) 209, may be formed within different vertical layers within each level. For example, the plurality of horizontally oriented digit lines 203-1, 203-2, . . . , 203-Q, extending in the first direction (D1) 209, may be disposed on, and in electrical contact with, top surfaces of first source/drain regions 221 and orthogonal to laterally oriented access devices 230 extending laterally in the second direction (D2) 205. In some embodiments, the plurality of horizontally oriented digit lines 203-1, 203-2, . . . , 203-Q, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the laterally oriented access device are formed. In some embodiments, the plurality of horizontally oriented digit lines 203-1, 203-2, . . . , 203-Q, extending in the first direction (D1) 209, may be connected to the top surfaces of the first source/drain regions 221 directly and/or through additional contacts including metal silicides.

As shown in the embodiment of FIG. 2B, the access lines, 207-1, 207-2, . . . , 207-Q, extend in a vertical direction with respect to the substrate 200, e.g., in a third direction (D3) 211. Further, as shown in FIG. 2B, the access lines, 207-1, 207-2, . . . , 207-Q, in one sub cell array may be spaced apart from each other in the first direction (D1) 209. The access lines, 207-1, 207-2, . . . , 207-Q, may be provided, extending vertically relative to the substrate 200 in the third direction (D3) 211 between a pair of the laterally oriented access devices 230 extending laterally in the second direction (D2) 205, but adjacent to each other on a level, e.g., first level (L1), in the first direction (D1) 209. Each of the access lines, 207-1, 207-2, . . . , 207-Q, may vertically extend, in the third direction (D3), on sidewalls of respective ones of the plurality of laterally oriented access devices 230 that are vertically stacked.

For example, and as shown in more detail in FIG. 3, a first one of the vertically extending access lines, e.g., 207-1, may be adjacent a sidewall of a channel region 225 to a first one of the laterally oriented access devices 230 in the first level (L1) 213-1, a sidewall of a channel region 225 of a first one of the laterally oriented access devices 230 in the second level (L2) 213-2, and a sidewall of a channel region 225 a first one of the laterally oriented access devices 230 in the third level (L3) 213-P, etc. Similarly, a second one of the vertically extending access lines, e.g., 207-2, may be adjacent a sidewall to a channel region 225 of a second one of the laterally oriented access devices 230 in the first level (L1) 213-1, spaced apart from the first one of laterally oriented access devices 230 in the first level (L1) 213-1 in the first direction (D1) 209. And the second one of the vertically extending access lines, e.g., 207-2, may be adjacent a sidewall of a channel region 225 of a second one of the laterally oriented access devices 230 in the second level (L2) 213-2, and a sidewall of a channel region 225 of a second one of the laterally oriented access devices 230 in the third level (L3) 213-P, etc. Embodiments are not limited to a particular number of levels. The vertically extending access lines, 207-1, 207-2, . . . , 207-Q, may include a conductive material, such as, for example, one of a doped semiconductor material, a conductive metal nitride, metal, and/or a metal-semiconductor compound.

As shown in FIG. 2B, a conductive body contact 295 may be formed extending in the first direction (D1) 209 along an end surface of the laterally oriented access devices 230 in each level (L1) 213-1, (L2) 213-2, and (L3) 213-P above the substrate 200. The body contact 295 may be connected to a body, as shown by 326 in FIG. 3, e.g., body region, of the laterally oriented access devices 230 in each memory cell, e.g., memory cell 210 in FIG. 2A. The body contact 295 may include a conductive material such as, for example, one of a doped semiconductor material, a conductive metal nitride, metal, and/or a metal-semiconductor compound.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates portions of a unit cell of a vertically stacked array of memory cells according to some embodiments of the present disclosure. As shown in FIG. 3, the first and the second source/drain regions, 321 and 323, may be impurity doped regions to the horizontally oriented access devices 330. The first and the second source/drain regions may be separated by a channel 325 formed in a body of semiconductor material, e.g., body region 326, of the laterally oriented access devices 330. The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 may be formed of a low doped (p-) p-type semiconductor material. In some embodiments, the body region 326 and the channel 325 separating the first and the second source/drain regions, 321 and 323, may include a low doped, p-type, e.g., low dopant concentration (p-), polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity, e.g., high dopant (n+), doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 may be of a p-type conductivity construction in which case the impurity, e.g., dopant, conductivity types would be reversed.

As shown in FIG. 3, the first source/drain region 321 may occupy an upper portion in the body 326 of the laterally oriented access devices 330. For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the horizontally oriented access device 330 may have a body portion 326 which is below the first source/drain region 321 and is in electrical contact with the body contact, e.g., 295 shown in FIG. 2B. Further, as shown in FIG. 3, a digit line 303-1 may disposed on a top surface 322 of the first source/drain region 321 and electrically coupled thereto.

As shown in FIG. 3, an access line 307-1 may be vertically extending in the third direction (D3) 311 adjacent sidewall of the channel region 325 portion of the body 326 to the horizontally oriented access devices 330 horizontally conducting between the first and the second source/drain regions 321 and 323 along the second direction (D2) 305. A gate dielectric material 304 may be interposed between the access line 307-1 (a portion thereof forming a gate to the laterally oriented access devices 330) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
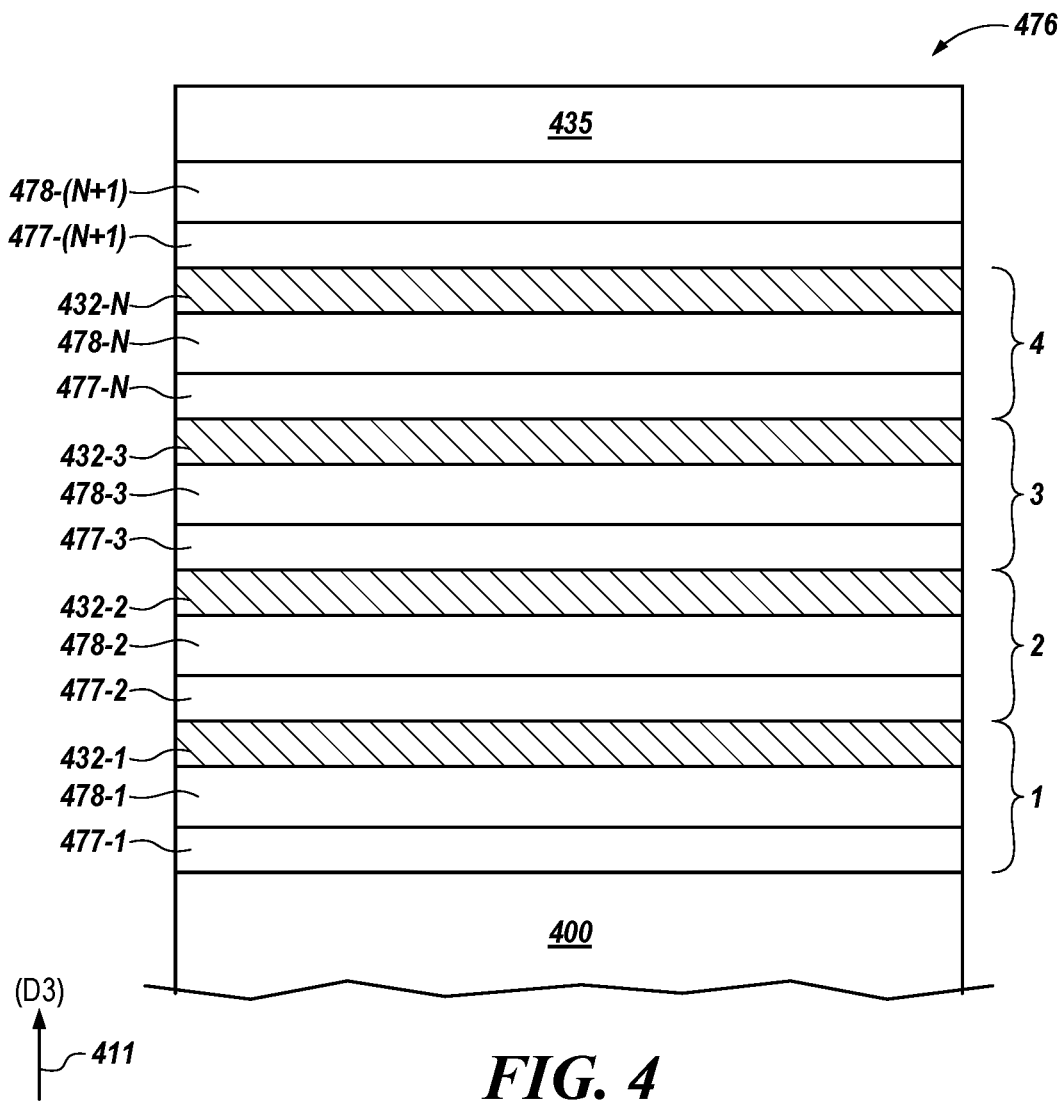
FIG. 4 illustrates a view of a semiconductor structure at a particular time in the fabrication process in accordance with a number of embodiments of the present disclosure.

FIG. 4 illustrates a view of a semiconductor structure at a particular time in the fabrication process in accordance with a number of embodiments of the present disclosure. As shown in FIG. 4, alternating layers of materials may be deposited to form a vertical stack 476. The alternating layers of materials may be deposited sequentially, e.g., such that a layer being deposited may be formed on a previously deposited layer. As shown in FIG. 4, a first dielectric material, 477-1, 477-2, . . . , 477-N (also referred to herein independently and/or collectively as "477"), a second dielectric material, 478-1, 478-2, . . . , 478-N (also referred to herein independently and/or collectively as "478"), and a sacrificial material, 432-1, 432-2, . . . , 432-N (also referred to herein independently and/or collectively as "432"), in repeating iterations to form a vertical stack 476 on a working surface of a semiconductor substrate 400. While the sacrificial material 432 is indicated to be sacrificial, e.g., selectively removable, embodiments provide that a number of other materials discussed herein may also be selectively removable. In one embodiment, the first dielectric material 477 and the second dielectric material 478 can respectively and independently be deposited to have a thickness, e.g., vertical height in the third direction (D3), in a range of ten (10) nanometers (nm) to one hundred (100) nm. In one embodiment, the semiconductor material 432 can be deposited to have a thickness, e.g., vertical height, in a range of ten (10) nm to one hundred fifty (150) nm. Embodiments, however, are not limited to these examples.

In one example, the sacrificial material, 432-1, 432-2, . . . , 432-N, can comprise a material such as polycrystalline silicon (Si), silicon nitride (SiN), or an oxide-based semiconductor composition. However, embodiments are not limited to these examples. Embodiments provide that the sacrificial material 432 may be selectively etched relative to the first dielectric material 477 and the second dielectric material 478. Embodiments provide that the first dielectric material 477 may be selectively etched relative to the sacrificial material 477 and the second dielectric material 478. Embodiments provide that the second dielectric material 478 may be selectively etched relative to the sacrificial material 477 and the first dielectric material 477.

As shown in FIG. 4, a vertical direction 411 is illustrated as a third direction (D3), e.g., z-direction in an x-y-z coordinate system, analogous to the third direction (D3), among first, second and third directions, shown in the previously discussed Figures. In the example of FIG. 4, four tiers, numbered 1, 2, 3, and 4, of the repeating iterations of the vertical stack 476 are shown. Embodiments, however, are not limited to this example and more or fewer repeating iterations may be included. A photolithographic hard mask (HM) layer 435 may be deposited as a top layer on the repeating iterations of the vertical stack 476, e.g., for performing one or more processing steps.

In some embodiments, the first dielectric material 477 or the second dielectric material 478 may be an interlayer dielectric (ILD). By way of example, and not by way of limitation, the first dielectric material 477 or the second dielectric material 478, may comprise a silicon dioxide ($SiO_2$) material. In another example the first dielectric material 477 or the second dielectric material 478 may comprise a silicon nitride ($Si_3N_4$) material (also referred to herein a "SiN"). In another example the first dielectric material 477 or the second dielectric material 478 may comprise a silicon oxy-carbide ($SiO_xC_y$) material (also referred to herein as "SiOC"). In another example the first dielectric material 477 or the second dielectric material 478 may include silicon oxy-nitride ($SiO_xN_y$) material (also referred to herein as "SiON"), and/or combinations thereof. Embodiments are not limited to these examples. In some embodiments the sacrificial material, 432 may comprise a silicon (Si) material in a polycrystalline and/or amorphous state. In another example the sacrificial material, 432 may comprise a silicon nitride (SiN) material. Embodiments, however, are not limited to these examples.

The repeating iterations of alternating first dielectric material 477, second dielectric material 478, and a sacrificial material, 432 layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers.

Figure 5A:
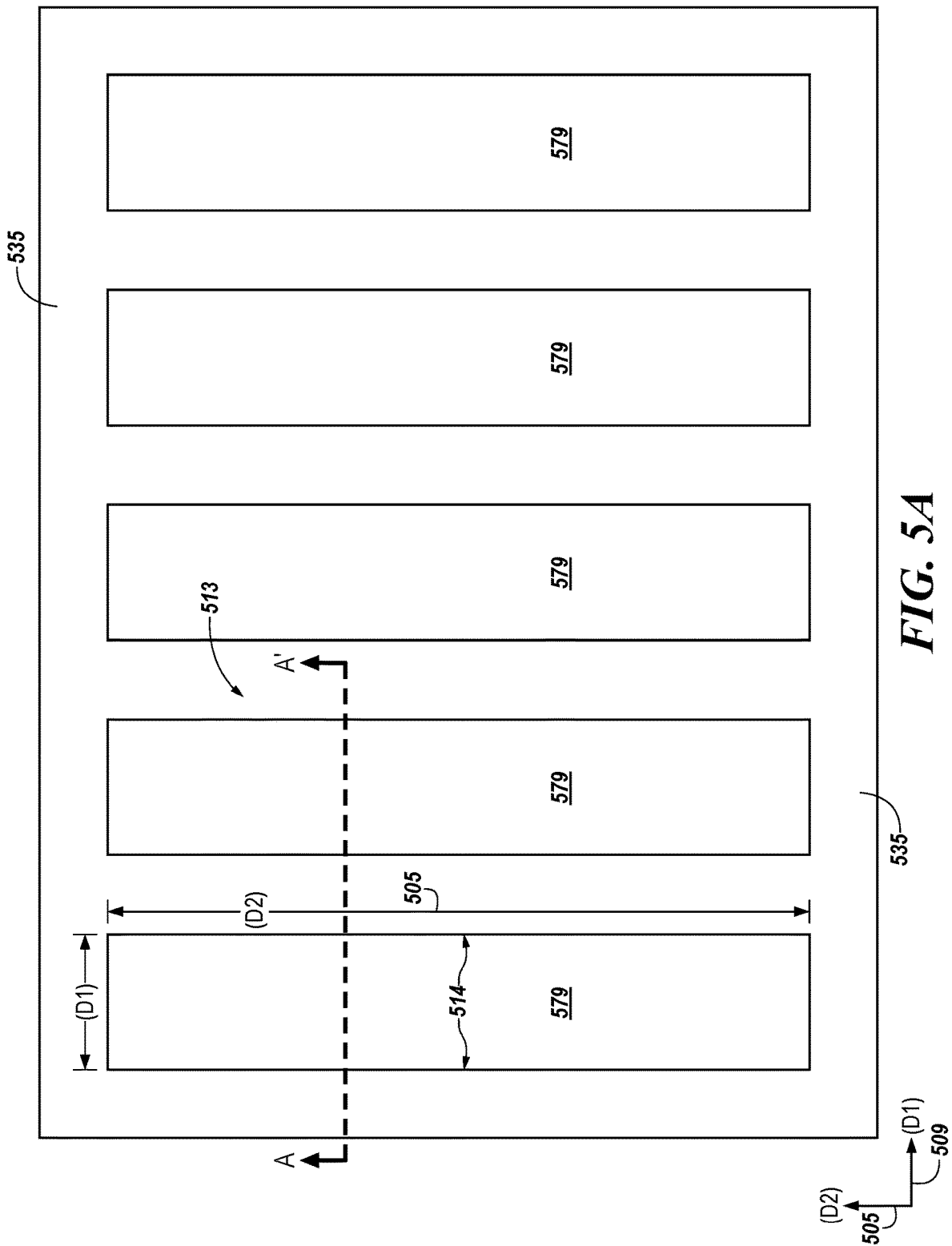
FIG. 5A illustrates a view of a semiconductor structure at a particular time in the fabrication process in accordance with a number of embodiments of the present disclosure.

FIG. 5A illustrates a view of a semiconductor structure at a particular time in the fabrication process in accordance with a number of embodiments of the present disclosure. FIG. 5A illustrates a top down view of a semiconductor structure. In the embodiment shown in FIG. 5A, an etchant process may be utilized to form a plurality of first vertical openings 579, having a first horizontal direction (D1) 509 and a second horizontal direction (D2) 505, through the vertical stack to the substrate. In one example, as shown in FIG. 5A, the plurality of first vertical openings 579 are extending predominantly in the second horizontal direction (D2) 505 and may form elongated vertical, pillar columns 513 with sidewalls in the vertical stack. The plurality of first vertical openings 579 may be formed using photolithographic techniques to pattern a photolithographic mask 535, e.g., to form a hard mask (HM), on the vertical stack prior to etching the plurality of first vertical openings 579.

FIG. 5B is a cross sectional view, taken along cut-line A-A' in FIG. 5A, showing another view of the semiconductor structure at a particular time in the semiconductor fabrication process. FIG. 5B illustrates that a conductive material 507-1, 507-2, 507-3, 507-4 may be formed on a gate dielectric material 504 in the plurality of first vertical openings 579. As an example, a gate dielectric material 504 may be conformally deposited in the plurality of first vertical openings 579 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 504 may be deposited to a particular thickness (t1) as suited to a particular design rule, e.g., a gate dielectric thickness of approximately 10 nanometers (nm), among other values. Embodiments, however, are not limited to this example. As an example, the gate dielectric 504 may comprise a silicon dioxide ($SiO_2$) material, aluminum oxide (Al2O3) material, high dielectric constant (k), e.g, high-k, dielectric material, and/or combinations thereof as also described herein.

Further, as shown in FIG. 5B, a conductive material 507-1, 507-2, 507-3, 507-4 may be conformally deposited in the plurality of first vertical openings 579 on a surface of the gate dielectric material 504. By way of example, and not by way of limitation, the conductive material 507 may be conformally deposited in the plurality of first vertical openings 579 on a surface of the gate dielectric material 504 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 504. The conductive material 507 may be conformally deposited to a particular thickness (t2) to form vertically oriented access lines and as suited to a particular design rule. For example, the conductive material 507 may be conformally deposited to a thickness of approximately 20 nanometers (nm), among other values. Embodiments, however, are not limited to this example. As an example, the conductive material 507 may be comprise a metal such as tungsten (W), metal composition, titanium nitride (TiN), doped polysilicon, and/or some other combination thereof as also described in herein.

As shown in FIG. 5B, the conductive material 507 may be recessed back to remain only along the vertical sidewalls of the elongated vertical, pillar columns, shown as 542-1, 542-2, and 542-3 in FIG. 5B. The conductive material 507 may be recessed back by using a suitable selective, anisotropic etch process to remove the conductive material 507 from a bottom surface of the first vertical openings, e.g., 579 in FIG. 5A, exposing the gate dielectric 504 on the bottom surface to form separate conductive materials 507-1, 507-2, 507-3, 507-4. As shown in FIG. 5B, a dielectric material 539, such as an oxide or other suitable spin on dielectric (SOD), may then be deposited in the first vertical openings 579, using a process such as CVD, to fill the first vertical openings 579. The dielectric may be planarized to a top surface of the hard mask 535 of the vertical semiconductor stack, using chemical mechanical planarization (CMP) or other suitable semiconductor fabrication technique. A subsequent photolithographic material 536, e.g., hard mask, may be deposited using CVD and planarized using CMP to cover and close the first vertical openings 500 over the conductive material 507. Similar semiconductor process techniques may be used at other points of the semiconductor fabrication process described herein.

A photolithographic process may be used to pattern the photolithographic mask 536. Additional photolithographic processes and/or photolithographic masks may be utilized. The process may be a selective, isotropic etchant process to remove portions of the exposed conductive material 507, to separate and individually form the plurality of separate, access lines 507. Hence the plurality of separate, vertical access lines 507 are shown along the sidewalls of the elongated vertical, pillar columns, e.g., along sidewalls of the elongated vertical, pillar columns 542-1, 542-2, and 542-3 in FIG. 5B.

Figure 6A:
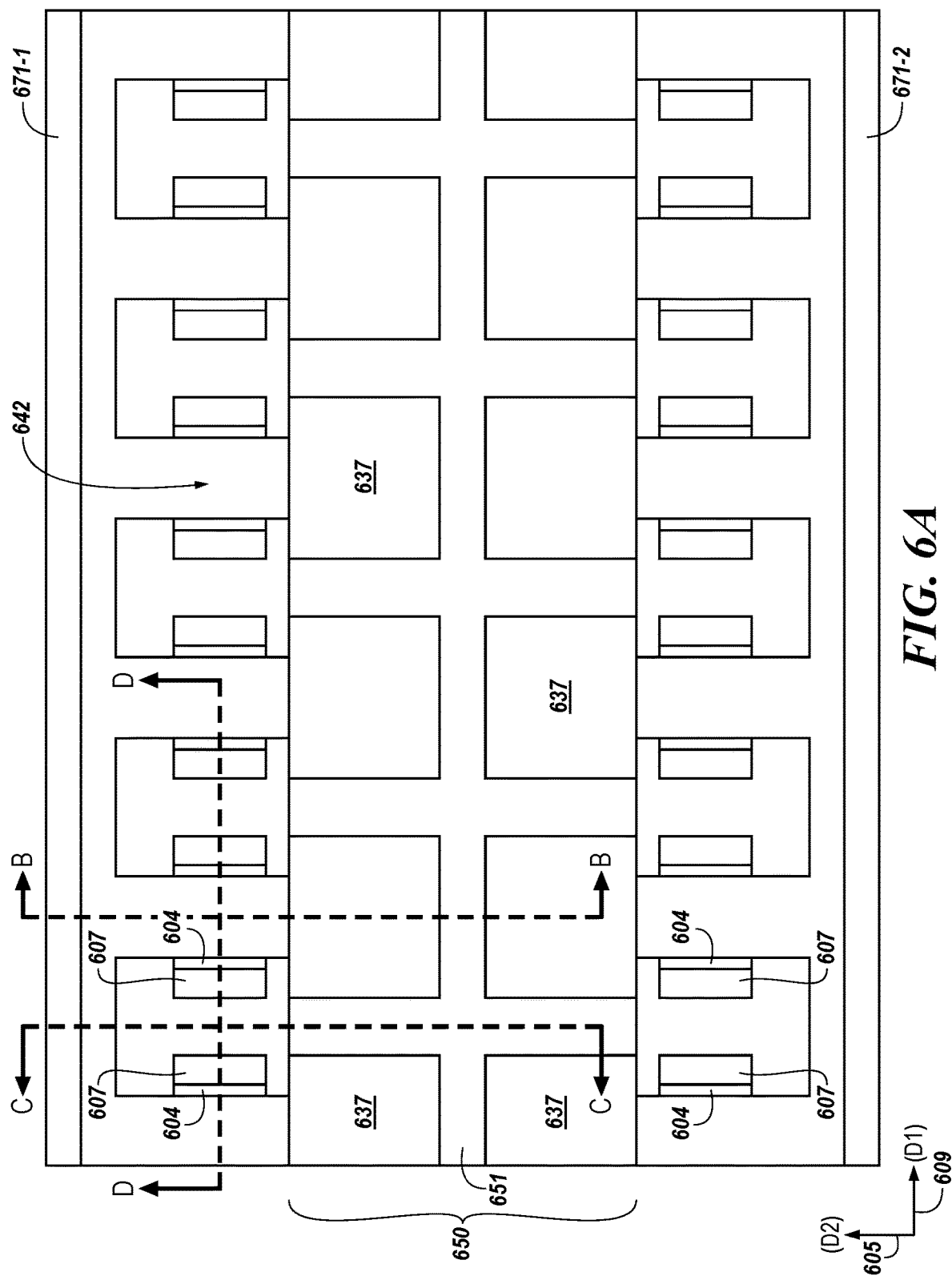
FIG. 6A illustrates a view of a semiconductor structure at a particular time in the fabrication process in accordance with a number of embodiments of the present disclosure.

FIG. 6A illustrates a view of a semiconductor structure at a particular time in the fabrication process in accordance with a number of embodiments of the present disclosure. FIG. 6A illustrates a top down view of a semiconductor structure. As shown FIG. 6A, one or more etchant processes may be utilized to form a vertical opening 651 in a storage node region 650 through the vertical stack and extending predominantly in the first horizontal direction (D1) 609. Also as shown FIG. 6A, one or more etchant processes may be utilized to form a vertical opening 671 through the vertical stack and extending predominantly in the first horizontal direction (D1) 609. The one or more etchant processes forms the vertical openings 651 and 671 to expose sidewalls in the alternating layers of the vertical stack.

According to embodiments, portions of the second dielectric material, i.e. the second dielectric material 478 as discussed with FIG. 4, can be selectively removed to form horizontal openings, in which the storage nodes may be formed. The portions of the second dielectric material to be removed may be accessed through vertical opening 651. As mentioned, embodiments provide that the second dielectric material 478 may be selectively etched relative to the sacrificial material 477 and the first dielectric material 477. The second dielectric material 478 may be recessed various distances from the vertical opening 651 for different applications. In some embodiments, this process, i.e. removing portions of the second dielectric material and forming storage nodes, is performed before selectively removing an access device region, e.g., transistor region, of the sacrificial material 432 in which to form the first source/drain region, the channel region, and the second source/drain region of the horizontally oriented access devices. In other embodiments, this process, i.e. removing portions of the second dielectric material and forming storage nodes, is performed after selectively removing an access device region of the sacrificial material 432 in which to form the first source/drain region, the channel region, and the second source/drain region of the horizontally oriented access devices.

A selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) may be utilized. As another example, a dry etch chemistries of $O_2$ or of $O_2$ and nitrogen ($N_2$) may be used. Alternatively, or in addition, a selective etch to remove portions of materials may comprise a selective etch chemistry of phosphoric acid ($H_3PO_4$) and/or dissolving a material using a selective solvent.

When fabricating the semiconductor device, a selective etchant process may be utilized to etch one or more materials and to form a respective horizontal opening therein. A selective etchant process may be performed such that the respective horizontal opening has a desired length, e.g., depth. Various horizontal opening lengths may be utilized for different applications. The horizontal opening lengths may be controlled by controlling etch time, composition of etchant gas, and/or etch rate of a reactant gas flowed into a vertical opening, e.g., rate, concentration, temperature, pressure, and time parameters.

FIG. 6A also illustrates conductive material 607, gate dielectric material 604, mask 637, and access device region 642.

Figure 6B:
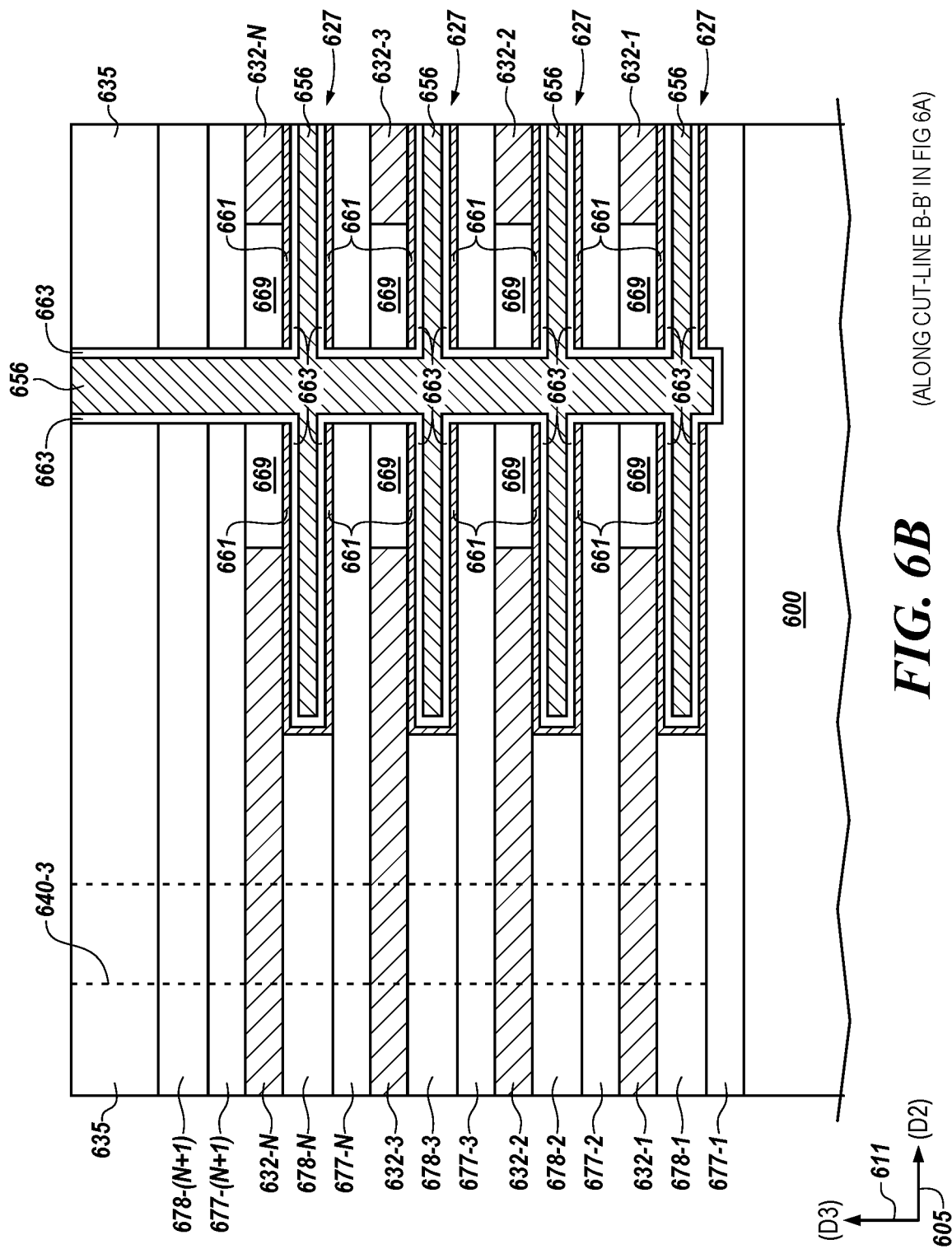
FIG. 6B illustrates a view of the semiconductor structure at a particular time in the fabrication process in accordance with a number of embodiments of the present disclosure.

FIG. 6B illustrates a view of the semiconductor structure at a particular time in the fabrication process in accordance with a number of embodiments of the present disclosure.

As shown in FIG. 6B, one or more embodiments provide that a dielectric material 669 may be formed in horizontal openings that were made by selectively removing portions of the sacrificial material 432. The portions of the second dielectric material to be removed may be accessed through vertical opening 651, for instance. The dielectric material 669 may be formed from various dielectric materials. The dielectric material 669 may comprise a dielectric material as discussed herein. One or more embodiments provide that the dielectric material 669 may be formed prior to selectively removing portions of the second dielectric material, i.e., the second dielectric material 478, as discuss further herein.

As shown in FIG. 6B, storage nodes 627 have been formed in horizontal openings that were made by selectively removing portions of the second dielectric material. In forming the storage nodes 627, a first electrode material 661, which may be referred to as a bottom electrode, can be deposited in the horizontal openings. After deposition of the first electrode material 661, a dielectric material 663 can be deposited on the first electrode material 661. Then, a second electrode material 656, e.g., a top electrode, can be deposited on the dielectric material 663. As shown in FIG. 6B, the top electrode 656 may be common to a number of storage nodes. Embodiments provide that the top electrodes 656 may be coupled to a common electrode plane, such as a ground plane.

The first electrode material 661 and the second electrode material 656 can be conductive materials. Non-limiting examples of the electrode materials include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide (RuO2) material.

Dielectric material 663 may be formed from various dielectric materials. Dielectric material 663 may be formed from a high dielectric constant (high-k) material. Dielectric material 663 may include aluminum oxide ($Al_2O_3$), zirconium oxide ($ZrO_2$), hafnium oxide ($HfO_2$), and/or lanthanum oxide ($La_2O_3$). One or more embodiments provide that $ZrO_2$(Zr oxide), $HfO_2$(Hf oxide), $La_2O_3$(La oxide), PZT (Lead Zirconate Titanate, Pb[Zr(x)Ti(1-x)]O3), $BaTiO_3$, $Al_2O_3$ or combinations thereof may be utilized, for example. One or more embodiments provide that the dielectric material 663 is a zirconium oxide material. The dielectric material 663 may be doped, e.g., with Si or Al from 0.1% to 5%. The dielectric material 663 can be deposited to have a thickness, e.g. a distance perpendicular from a surface the dielectric material 663 is deposited on, from 5 to 70 nm. Embodiments are not limited to these example materials or thickness for the dielectric material.

Figure 6C:
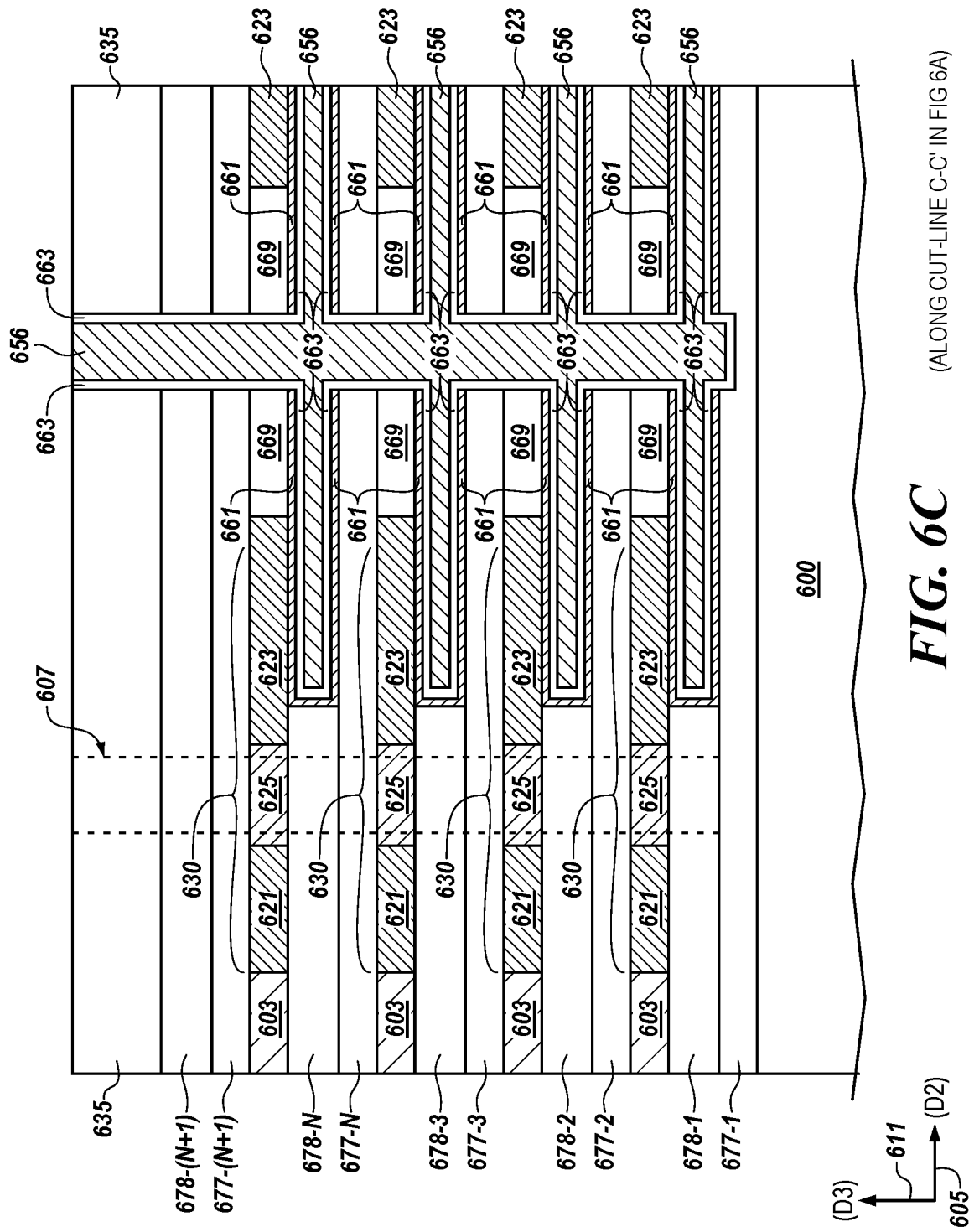
FIG. 6C illustrates a view of the semiconductor structure at a particular time in the fabrication process in accordance with a number of embodiments of the present disclosure.

FIG. 6C illustrates a view of the semiconductor structure at a particular time in the fabrication process in accordance with a number of embodiments of the present disclosure. As shown in FIG. 6C, access devices 630 have been formed in horizontal openings that were made by selectively removing portions of the sacrificial material. The horizontally oriented access devices 630 extend predominantly in the second direction 605 (D2), and current flows predominantly in the second direction 605 (D2), e.g., from source/drain region to channel region to source/drain region.

According to embodiments, portions of the sacrificial material i.e. the sacrificial material 432 as discussed with FIG. 4, can be removed, as discussed herein, to form horizontal openings, in which the access devices may be formed. The portions of the sacrificial material to be removed may be accessed through vertical opening 671, for instance. The horizontal openings, in which the access devices may be formed, can be formed by selectively etching the access device region of the sacrificial material 432 to form horizontal openings a horizontal distance back from the vertical openings 671 in the vertical stack.

Embodiments provide, as shown in FIG. 6C, forming a transistor having a first source/drain region, channel region, and second source/drain region as the access device in the first horizontal opening. By way of example, and not by way of limitation, forming the first source/drain region 621, the channel region 625, and the second source/drain region 623 comprises using an atomic layer deposition (ALD) process to sequentially deposit, in the formed horizontal opening, the first source/drain region, the channel region, and the second source/drain region. Other suitable semiconductor fabrication techniques and/or storage nodes structures may be used.

FIG. 6C illustrates a view of the semiconductor structure at a particular time in the fabrication process in accordance with a number of embodiments of the present disclosure. As shown in FIG. 6C, digit lines 603 may be formed in electrical contact, e.g., direct contact, with the first source/drain region 621 of the horizontally oriented access device 630. The digit lines 603 may be formed by utilizing one or more processes discussed herein. For instance, a conductive material, e.g., 603, may be deposited in horizontal openings that were made by selectively removing portions of the sacrificial material 632, shown in FIG. 6B. Alternatively, vertical openings can be formed in the vertical stack, e.g. vertical stack 476, for deposition of the conductive material for digit line formation. As previously mentioned, one or more embodiments provide that horizontal digit lines and vertical access lines may be utilized. One or more embodiments provide that horizontal access lines and vertical digital lines may be utilized. In some embodiments, the conductive material 603 may be formed from a silicide. In some embodiments, the conductive material 603 may comprise a titanium material. In some embodiments, the conductive material 603 may comprise a titanium nitride (TiN) material. In some embodiments, the conductive material 603 may comprise a Ruthenium (Ru) material. In some embodiments, the conductive material may be tungsten (W). However, embodiments are not so limited.

FIG. 6D illustrates a view of the semiconductor structure at a particular time in the fabrication process in accordance with a number of embodiments of the present disclosure. As shown in FIG. 6D, the digit line 603 may be formed such that it is vertically separated from the access device 630. As shown in FIG. 6D, the digit line 603 may be formed on, i.e. above, the first source/drain 621 of the access device 630. While not shown in FIG. 6D, one or more embodiments provide that the digit line 603 is vertically separated from the access device 630, such that the first source/drain 621 of the access device 630 is formed on, i.e. above, the digit line 603. Dielectric material 657 and dielectric material 658 may be deposited and be utilized to space components, e.g. of neighboring cells, apart from one another.

Figure 7:
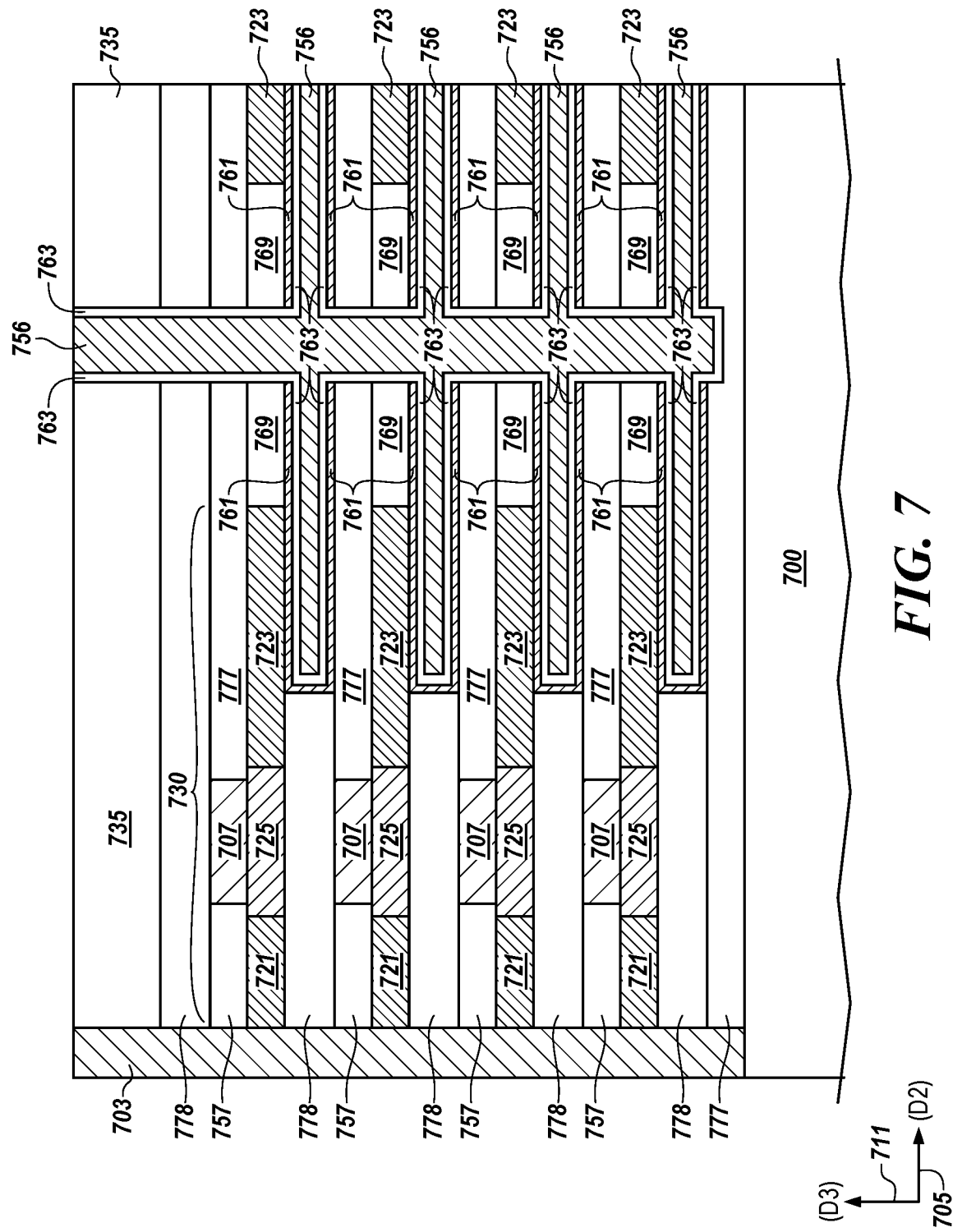
FIG. 7 illustrates a view of a semiconductor structure at a particular time in a fabrication process in accordance with a number of embodiments of the present disclosure.

FIG. 7 illustrates a view of a semiconductor structure at a particular time in a fabrication process in accordance with a number of embodiments of the present disclosure. As shown in FIG. 7, vertical digit lines 703 and horizontal word lines 707, e.g., as shown in FIGS. 1A and 1B, may be utilized. While FIG. 7 illustrates the respective horizontal word lines 707 above the respective access devices 730, embodiments are not so limited. For example, embodiments provide that respective horizontal word lines may be located above, below, and/or beside, e.g., wrapped around, respective access devices. The semiconductor structure can be made with processes, e.g., deposition and selective etching, as discussed herein.

Figure 8:
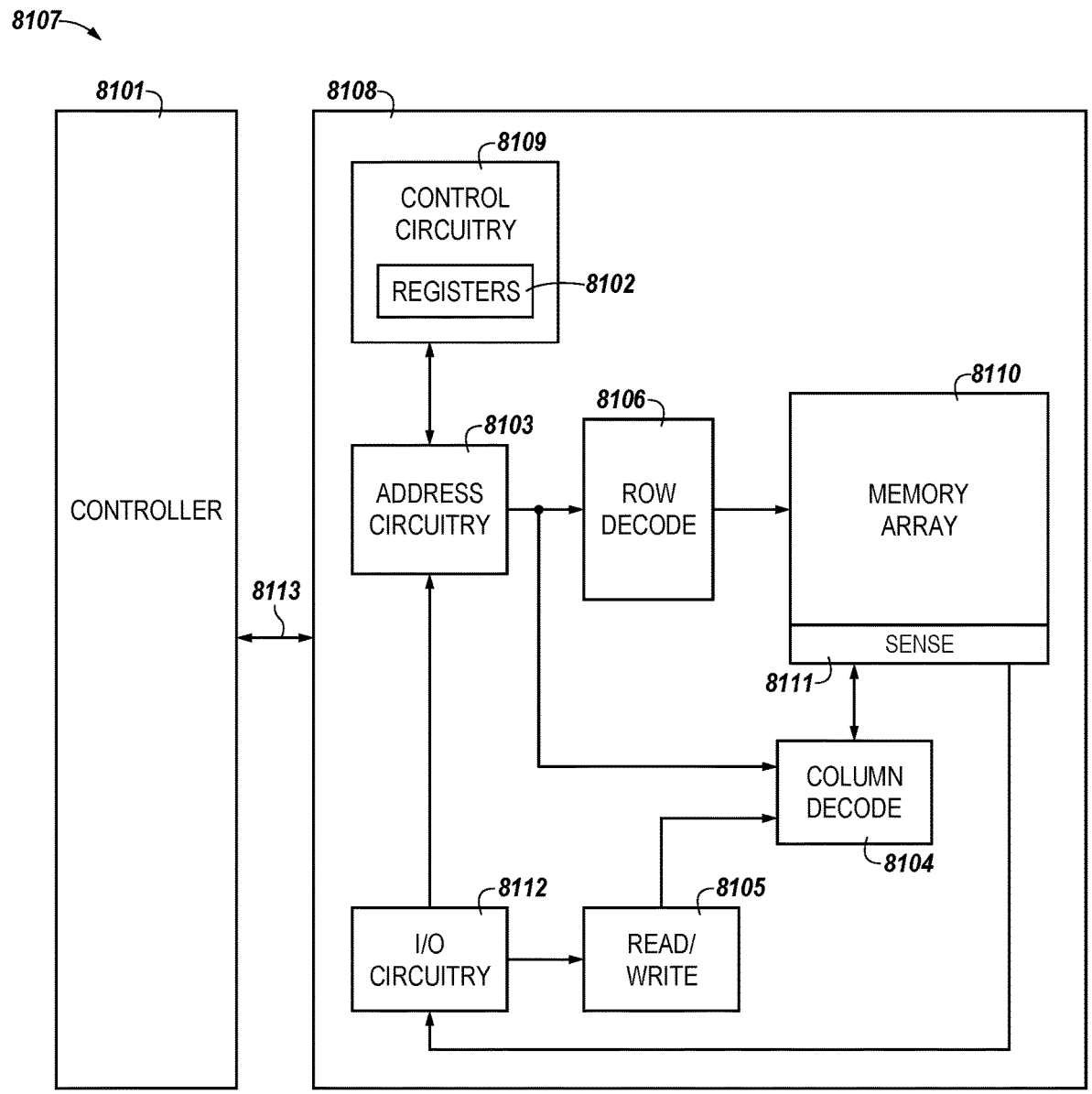
FIG. 8 is a block diagram of an apparatus in accordance with a number of embodiments of the present disclosure.

FIG. 8 is a block diagram of an apparatus in accordance with a number of embodiments of the present disclosure. FIG. 8 is a block diagram of an apparatus in the form of a computing system 8107 including a memory device 8108 in accordance with a number of embodiments of the present disclosure. As used herein, a memory device 8108, a memory array 8110, and/or a host 8101, for example, might also be separately considered an "apparatus." According to embodiments, the memory device 8101 may comprise at least one memory array 8110 with a memory cell formed having a digit line and body contact, according to the embodiments described herein.

In this example, system 8107 includes a host 8101 coupled to memory device 8108 via an interface 8113. The computing system 8107 can be a personal laptop computer, a desktop computer, a digital camera, a mobile telephone, a memory card reader, or an Internet-of-Things (IoT) enabled device, among various other types of systems. Host 8101 can include a number of processing resources, e.g., one or more processors, microprocessors, or some other type of controlling circuitry, capable of accessing memory 8108. The system 8107 can include separate integrated circuits, or both the host 8101 and the memory device 8108 can be on the same integrated circuit. For example, the host 8101 may be a system controller of a memory system comprising multiple memory devices 8108, with the system controller 8109 providing access to the respective memory devices 8108 by another processing resource such as a central processing unit (CPU).

In the example shown in FIG. 8, the host 8101 is responsible for executing an operating system (OS) and/or various applications, e.g., processes, that can be loaded thereto, e.g., from memory device 8108 via controller 8109. The OS and/or various applications can be loaded from the memory device 8108 by providing access commands from the host 8101 to the memory device 8108 to access the data comprising the OS and/or the various applications. The host 8101 can also access data utilized by the OS and/or various applications by providing access commands to the memory device 8108 to retrieve said data utilized in the execution of the OS and/or the various applications.

For clarity, the system 8107 has been simplified to focus on features with particular relevance to the present disclosure. The memory array 8110 can be a DRAM array comprising at least one memory cell having a digit line and body contact formed according to the techniques described herein. For example, the memory array 8110 can be an unshielded DL 4F2 array such as a 3D-DRAM memory array. The array 8110 can comprise memory cells arranged in rows coupled by word lines, which may be referred to herein as access lines or select lines, and columns coupled by digit lines, which may be referred to herein as sense lines or data lines. Although a single array 8110 is shown in FIG. 8, embodiments are not so limited. For instance, memory device 8108 may include a number of arrays 8110, e.g., a number of banks of DRAM cells.

The memory device 8101 includes address circuitry 8103 to latch address signals provided over an interface 8113. The interface can include, for example, a physical interface employing a suitable protocol, e.g., a data bus, an address bus, and a command bus, or a combined data/address/command bus. Such protocol may be custom or proprietary, or the interface 8113 may employ a standardized protocol, such as Peripheral Component Interconnect Express (PCIe), Gen-Z, CCIX, or the like. Address signals are received and decoded by a row decoder 8106 and a column decoder 8104 to access the memory array 8110. Data can be read from memory array 8110 by sensing voltage and/or current changes on the sense lines using sensing circuitry 8111. The sensing circuitry 8111 can comprise, for example, sense amplifiers that can read and latch a page, e.g., row, of data from the memory array 8110. The I/O circuitry 8112 can be used for bi-directional data communication with the host 8101 over the interface 8113. The read/write circuitry 8105 is used to write data to the memory array 8110 or read data from the memory array 8110. As an example, the circuitry 8105 can comprise various drivers, latch circuitry, etc.

Control circuitry 8109 decodes signals provided by the host 8101. The signals can be commands provided by the host 8101. These signals can include chip enable signals, write enable signals, and address latch signals that are used to control operations performed on the memory array 8110, including data read operations, data write operations, and data erase operations. In various embodiments, the control circuitry 8109 is responsible for executing instructions from the host 8101. The control circuitry 8109 can comprise a state machine, a sequencer, and/or some other type of control circuitry, which may be implemented in the form of hardware, firmware, or software, or any combination of the three. In some examples, the host 8101 can be a controller external to the memory device 8108. For example, the host 8101 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements, e.g., by direct physical contact, indirectly coupled and/or connected with intervening elements, or wirelessly coupled. The term coupled may further include two or more elements that co-operate or interact with each other, e.g., as in a cause and effect relationship. An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction, e.g., the y-direction or the x-direction, that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A three-dimensional memory device, comprising:
    an array of vertically stacked memory cells, the array of vertically stacked memory cells, comprising:
        horizontally oriented access devices each respectively having a first source/drain region and a second source/drain region separated by a channel region, and gates opposing the channel region and separated therefrom by a gate dielectric;
        access lines coupled to the gates and separated from the channel region by the gate dielectric;
        horizontally oriented storage nodes electrically coupled to the respective second source/drain regions of the access devices, wherein the horizontally oriented storage nodes are respectively vertically separated from the horizontally oriented access devices and a horizontal surface of the second source/drain region provides an interface with the storage node; and
        digit lines electrically coupled to the second source/drain regions of the horizontally oriented access devices.

2. The three-dimensional memory device of claim 1, wherein the horizontally oriented storage nodes are respectively vertically below the horizontally oriented access devices.

3. The three-dimensional memory device of claim 1, wherein the second source/drain regions of the access devices each comprise a respective second source/drain region vertical surface and a respective second source/drain region horizontal surface, and wherein each respective second source/drain region horizontal surface has an area greater than each respective second source/drain region vertical surface.

4. The three-dimensional memory device of claim 3, wherein the first source/drain regions of the access devices each comprise a respective first source/drain region horizontal surface, and wherein each respective second source/drain region horizontal surface has an area greater than each respective first source/drain region horizontal surface.

5. The three-dimensional memory device of claim 4, wherein the first source/drain regions of the access devices each comprise a respective first source/drain region vertical surface, and wherein each respective first source/drain region vertical surface has an area equal to each respective second source/drain region vertical surface.

6. The three-dimensional memory device of claim 1, wherein each of the horizontally oriented storage nodes includes a respective bottom electrode material, a respective insulator material, and a respective top electrode material.

7. The three-dimensional memory device of claim 6, wherein each of the top electrode material is a common electrode material for a plurality of horizontally oriented storage nodes.

8. The three-dimensional memory device of claim 1, wherein the horizontally oriented storage nodes are metal-insulator-metal capacitors.

9. The three-dimensional memory device of claim 1, wherein the access lines are vertically oriented and the digit lines are horizontally oriented.

10. The three-dimensional memory device of claim 1, wherein the access lines are horizontally oriented and the digit lines are vertically oriented.

11. A method for forming arrays of vertically stacked memory cells, the method comprising:
forming storage nodes of a first vertical tier, wherein each storage node corresponds to a respective memory cell;
forming access devices of the first vertical tier, wherein each access device comprises a respective first source/drain region, a respective second source/drain, and a respective channel region and each access device corresponds to a respective storage node, wherein the access devices are vertically separated from the respective storage nodes in the first vertical tier and respective horizontal surfaces of the respective second source/drain regions provide respective interfaces with the storage nodes, wherein the second source/drain regions of the access devices each comprise a respective second source/drain region vertical surface and a respective second source/drain region horizontal surface, and wherein each respective second source/drain region horizontal surface has an area greater than each respective second source/drain region vertical surface, and wherein the first source/drain regions of the access devices each comprise a respective first source/drain region horizontal surface, and wherein each respective second source/drain region horizontal surface has an area greater than each respective first source/drain region horizontal surface.

12. The method of claim 11, wherein each of the second source/drain regions is vertically adjacent to the respective storage nodes.

13. A method for forming arrays of vertically stacked memory cells, the method comprising:
forming a first sacrificial material of a vertical stack;
forming a second sacrificial material on the first sacrificial the vertical stack; wherein the first sacrificial material is different than the second sacrificial material;
selectively etching the first sacrificial material to form a first horizontal opening in the vertical stack;
forming a storage node in the first horizontal opening in the vertical stack;
selectively etching the second sacrificial material to form a second horizontal opening in the vertical stack;
forming a horizontally oriented access device in the second horizontal opening, wherein the horizontally oriented access device comprises a first source/drain region, a channel region, and a second source/drain region having a horizontal surface that provides an interface with the storage node.

14. The method of claim 13, wherein each of the plurality of horizontally oriented access devices is vertically separated from the corresponding respective storage node.

15. The method of claim 14, wherein each of the plurality of horizontally oriented access devices is vertically adjacent to the second source/drain region of the corresponding respective storage node.

16. The method of claim 13, wherein the plurality of horizontally oriented access devices are formed prior to forming the plurality of storage nodes.

17. The method of claim 13, wherein the plurality of horizontally oriented access devices are formed subsequent to forming the plurality of storage nodes.

18. The method of claim 13, wherein a first portion of the plurality of horizontally oriented access devices and the plurality of storage nodes are formed in a first vertical tier and a second portion of the plurality of horizontally oriented access devices and the plurality of storage nodes are formed in a second vertical tier.

* * * * *